United States Patent
Hussein

(10) Patent No.: US 11,567,414 B2
(45) Date of Patent: Jan. 31, 2023

(54) DEVICES, SYSTEMS, AND METHODS FOR THE HYBRID GENERATION OF DROP PATTERNS

(71) Applicant: CANON KABUSHIKI KAISHA, Tokyo (JP)

(72) Inventor: Ahmed M. Hussein, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/331,173

(22) Filed: May 26, 2021

(65) Prior Publication Data

US 2022/0382170 A1    Dec. 1, 2022

(51) Int. Cl.
    *G03F 7/20*    (2006.01)
    *G03F 9/00*    (2006.01)
    *G03F 7/00*    (2006.01)

(52) U.S. Cl.
CPC ........ *G03F 7/70508* (2013.01); *G03F 7/0002* (2013.01); *G03F 7/70625* (2013.01); *G03F 9/7042* (2013.01)

(58) Field of Classification Search
None
See application file for complete search history.

(56) References Cited

U.S. PATENT DOCUMENTS

| | | | |
|---|---|---|---|
| 6,074,430 A | 6/2000 | Tsukiboshi | |
| 6,292,809 B1 | 9/2001 | Edelman | |
| 7,014,295 B2 | 3/2006 | Hickman | |
| 8,119,052 B2 | 2/2012 | Schumaker | |
| 8,232,903 B2 | 7/2012 | Hsu | |
| 8,512,797 B2 | 8/2013 | Schumaker | |
| 8,586,126 B2 | 11/2013 | Schumaker | |
| 9,377,777 B2 | 6/2016 | Nakagawa | |
| 9,483,588 B2 | 11/2016 | Nehme | |
| 10,029,456 B2 | 7/2018 | Nakagawa | |
| 10,417,820 B2 | 9/2019 | Samavati | |
| 10,707,078 B2 | 7/2020 | Tamura | |
| 2007/0005550 A1 | 1/2007 | Klein | |
| 2018/0329315 A1 | 11/2018 | Hirano | |
| 2019/0351589 A1 | 11/2019 | Aihara | |
| 2020/0292934 A1* | 9/2020 | Simpson | ............. B29C 35/0805 |
| 2020/0401040 A1 | 12/2020 | Khusnatdinov | |

* cited by examiner

*Primary Examiner* — Michael P. Rodriguez
(74) *Attorney, Agent, or Firm* — Canon U.S.A., Inc. IP Division

(57) ABSTRACT

Some devices, systems, and methods obtain a material map of a region; divide the region into a plurality of subregions; perform, for each of one or more subregions of the plurality of subregions, a first drop-pattern-generation process, wherein the first drop-pattern-generation process generates a respective initial drop pattern for the subregion based on the material map; and perform, for each of the one or more subregions of the plurality of subregions, a second drop-pattern-generation process, wherein the second drop-pattern-generation process generates a respective revised drop pattern for the subregion based on the material map and on the respective initial drop pattern for the subregion.

16 Claims, 14 Drawing Sheets

DEVICES, SYSTEMS, AND METHODS FOR THE HYBRID GENERATION OF DROP PATTERNS

BACKGROUND

Technical Field

This application generally concerns generating drop patterns for imprint lithography.

Background

Nano-fabrication includes the fabrication of very small structures that have features that are 100 nanometers or smaller. One application of nano-fabrication is the fabrication of integrated circuits. The semiconductor-processing industry continues to strive for larger production yields while increasing the circuits per unit area formed on a substrate. Improvements in nano-fabrication include providing greater process control and increasing throughput while also allowing continued reduction of the minimum feature dimensions of the structures formed.

One nano-fabrication technique is commonly referred to as nanoimprint lithography. Nanoimprint lithography is useful in a variety of applications including, for example, fabricating one or more layers of integrated devices. Examples of integrated devices include CMOS logic, microprocessors, NAND Flash memory, NOR Flash memory, DRAM memory, MRAM, 3D cross-point memory, Re-RAM, Fe-RAM, STT-RAM, MEMS, and the like. Examples of nanoimprint lithography systems and processes are described in detail in numerous publications, such as U.S. Pat. Nos. 8,349,241, 8,066,930, and 6,936,194.

The nanoimprint lithography technique disclosed in each of the aforementioned patents describes the formation of a relief pattern in a formable material (polymerizable) layer and transferring a pattern corresponding to the relief pattern into or onto an underlying substrate. The patterning process uses a template spaced apart from the substrate, and a formable liquid is applied between the template and the substrate. The formable liquid is solidified to form a solid layer that has a pattern conforming to a shape of the surface of the template that is in contact with the formable liquid. After solidification, the template is separated from the solidified layer such that the template and the substrate are spaced apart. The substrate and the solidified layer are then subjected to additional processes, such as etching processes, to transfer a relief image into or onto the substrate that corresponds to the pattern in the solidified layer. The patterned substrate can be further subjected to known procedures and processes for device (article) fabrication, including, for example, curing, oxidation, layer formation, deposition, doping, planarization, etching, formable material removal, dicing, bonding, packaging, and the like.

SUMMARY

Some embodiments of a method for generating a drop pattern comprise obtaining a material map of a region; dividing the region into a plurality of subregions; performing, for each of one or more subregions of the plurality of subregions, a first drop-pattern-generation process, wherein the first drop-pattern-generation process generates a respective initial drop pattern for the subregion based on the material map; and performing, for each of the one or more subregions of the plurality of subregions, a second drop-pattern-generation process, wherein the second drop-pattern-generation process generates a respective revised drop pattern for the subregion based on the material map and on the respective initial drop pattern for the subregion.

Some embodiments of an apparatus comprise a one or more computer-readable storage media; and one or more processors that are in communication with the one or more computer-readable media and that cooperate with the one or more computer-readable storage media to cause the apparatus to obtain a material map of a region; divide the region into a plurality of subregions; perform, for a first subregion of the plurality of subregions, a first drop-pattern-generation process, wherein the first drop-pattern-generation process generates a respective initial drop pattern for the first subregion based on the material map; and perform, for the first subregion, a second drop-pattern-generation process, wherein the second drop-pattern-generation process generates a respective revised drop pattern for the first subregion based on the material map and on the respective initial drop pattern for the first subregion.

Some embodiments of one or more computer-readable storage media store instructions that, when executed by one or more computing devices, cause the one or more computing devices to perform operations that comprise obtaining a material map of a region; dividing the region into a plurality of subregions; performing, for each of one or more subregions of the plurality of subregions, a first drop-pattern-generation process, wherein the first drop-pattern-generation process generates a respective initial drop pattern for the subregion based on the material map; and performing, for each of the one or more subregions of the plurality of subregions, a second drop-pattern-generation process, wherein the second drop-pattern-generation process generates a respective revised drop pattern for the subregion based on the material map and on the respective initial drop pattern for the subregion.

DESCRIPTION

Figure 1:
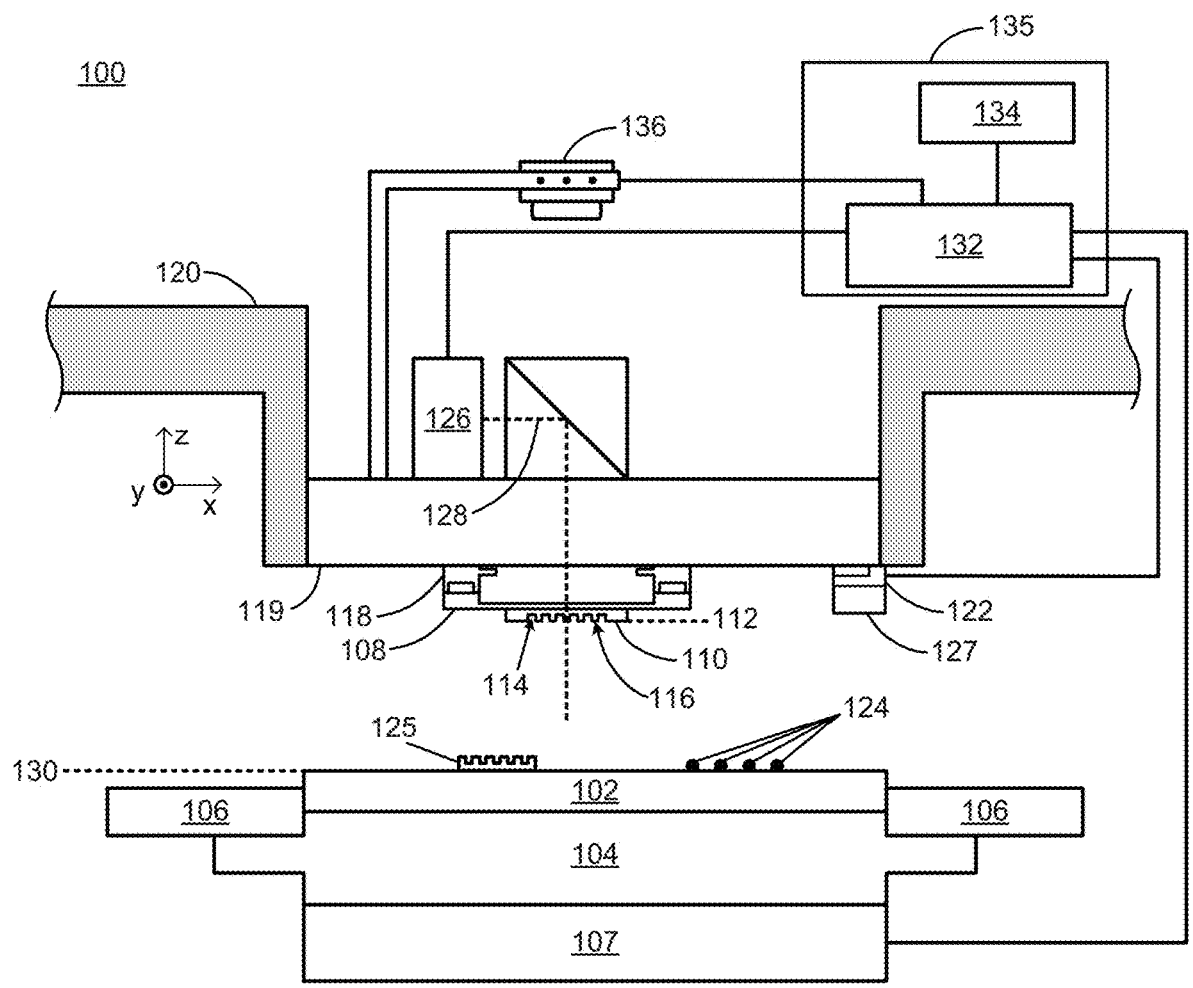
FIG. 1 illustrates an example embodiment of a nanoimprint lithography system.

The following paragraphs describe certain explanatory embodiments. Other embodiments may include alternatives, equivalents, and modifications. Additionally, the explanatory embodiments may include several features, and a particular feature may not be essential to some embodiments of the devices, systems, and methods that are described herein. Furthermore, some embodiments include features from two or more of the following explanatory embodiments.

Also, as used herein, the conjunction "or" generally refers to an inclusive "or," though "or" may refer to an exclusive "or" if expressly indicated or if the context indicates that the "or" must be an exclusive "or."

Furthermore, in this description and the drawings, an alphabetic suffix on a reference number may be used to indicate a specific instance of the feature identified by the reference numeral. For example, the imprint fields in a group of imprint fields may be identified with the reference numeral 141 when a particular imprint field is not being distinguished. However, 141A may be used to identify a specific imprint field when the specific imprint field is being distinguished from the rest of the imprint fields 141.

FIG. 1 illustrates an example embodiment of a nanoimprint lithography system 100. When operating, the nanoimprint lithography system 100 deposits drops 124 of formable material (e.g., resist) on a substrate 102 (e.g., a wafer) and forms a patterned layer 125, which has a relief pattern, in the formable material in an imprint field on the substrate 102 by using a template 108 to imprint the formable material on the substrate 102. The template 108 includes a mesa (also referred to as a mold) 110 that has a patterning surface 112. And a single mesa 110 may be used to imprint formable material in a plurality of imprint fields on a single substrate 102 or a plurality of substrates 102.

In the embodiment of the nanoimprint lithography system 100 in FIG. 1, the perimeter of the substrate 102 is surrounded by an applique 106. The applique 106 may be configured to stabilize the local gas environment beneath the template 108 or help protect the patterning surface 112 from particles, for example when the template is not above the substrate surface 130. Furthermore, an upper surface of the applique 106 may be below (e.g., as shown in FIG. 1) or coplanar with the substrate surface 130.

Also, the substrate 102 is coupled to a substrate chuck 104, which also supports the applique 106. Examples of substrate chucks 104 include the following: vacuum chucks, pin-type chucks, groove-type chucks, electrostatic chucks, and electromagnetic chucks. In some embodiments, such as the embodiment shown in FIG. 1, the applique 106 is mounted on the substrate chuck 104 without any part of the applique being sandwiched between the substrate chuck 104 and the substrate 102. The substrate chuck 104 is supported by the substrate positioning stage 107.

The substrate positioning stage 107 may provide translational or rotational motion along one or more of the x, y, z, θ, and φ-axes. The substrate positioning stage 107, the substrate 102, and the substrate chuck 104 may also be positioned on a base (not shown). Additionally, the substrate positioning stage 107 may be a part of a positioning system or a positioning subsystem.

The template 108 may include a body that includes the mesa 110 (also referred to as a mold), which extends toward the substrate 102 along the z axis. The mesa 110 may have a patterning surface 112 thereon. Also, the template 108 may be formed without the mesa 110. Thus, in some embodiments, the surface of the template 108 that faces the substrate 102 functions as the mesa 110, and the patterning surface 112 is included on the surface of the template 108 that faces the substrate 102. Examples of materials that may constitute the template 108 or the mesa 110 include the following: fused-silica, quartz, silicon, organic polymers, siloxane polymers, borosilicate glass, fluorocarbon polymers, metal, and hardened sapphire.

The patterning surface 112 has features that are defined by a plurality of spaced-apart template recesses 114 or template protrusions 116, although some embodiments include other configurations (e.g., a planar surface). The patterning surface 112 defines a pattern that forms the basis (e.g., an inverse) of the relief pattern of the patterned layer 125, which is formed from the drops 124 of formable material on the substrate 102. In some embodiments, the patterning surface 112 is featureless, in which case a planar surface is formed from formable material on the substrate 102. In some embodiments (e.g., embodiments that perform Inkjet-based Adaptive Planarization (IAP)), the patterning surface 112 is featureless and is substantially the same size as the substrate 102, in which case a planar surface is formed from formable material across the entire substrate 102.

The template 108 may be coupled to a template chuck 118. Examples of template chucks 118 include the following: vacuum chucks, pin-type chucks, groove-type chucks, electrostatic chucks, and electromagnetic chucks. The template chuck 118 may be configured to apply a force to the template 108 that varies across the template 108. The template chuck 118 may be coupled to an imprint head 119, which in turn may be moveably coupled to a bridge 120 such that the template chuck 118, the imprint head 119, and the template 108 are moveable in at least the z-axis direction. In some embodiments, the template chuck 118, the imprint head 119, and the template 108 are also movable in one or more of the x, y, θ, and φ-axes directions. The nanoimprint lithography system 100 may include one or more motors that move the template 108, the template chuck 118, or the imprint head 119.

The nanoimprint lithography system 100 also includes a fluid dispenser 122. The fluid dispenser 122 may include fluid-dispense head 127 and fluid-dispense ports. FIG. 2B illustrates an example embodiment of a fluid-dispense head 127 and fluid-dispense ports 129. The fluid-dispense ports 129 may have a fixed configuration such that the fluid-dispense head 127 and fluid-dispense ports 129 move as a unit and do not move independently of each other. Thus, the fluid-dispense ports 129 may be fixed relative to one another on the fluid-dispense head 127. The number of fluid-dispense ports 129 can vary between embodiments. Although the embodiment in FIG. 2B has six fluid-dispense ports 129, some embodiments have a different number of fluid-dispense ports 129, such as at least two fluid-dispense ports 129, at least three fluid-dispense ports 129, at least four fluid-dispense ports 129, at least five fluid-dispense ports 129, at least ten fluid-dispense ports 129, and at least twenty fluid-dispense ports 129. In some embodiments, the fluid-dispense ports 129 include a set of at least three fluid-dispense ports 129 that lie along a line. In some embodiments, the fluid-dispense head 127 includes hundreds of fluid-dispense ports that lie along multiple parallel lines.

The fluid dispenser 122 may also be moveably coupled to the bridge 120. In some embodiments, the fluid dispenser 122 and the template chuck 118 share one or more positioning components. And in some embodiments, the fluid dispenser 122 and the template chuck 118 move independently of each other. Also, in some embodiments, the fluid dispenser 122 and the template chuck 118 are located in different subsystems of the nanoimprint lithography system 100, and the substrate 102 is moved between the different subsystems.

When operating, the fluid-dispense ports 129 of the fluid dispenser 122 deposits drops 124 of liquid formable material onto the substrate 102 according to a drop pattern. The formable material may be, for example, a resist (e.g., photo resist) or another polymerizable material, and the formable material may comprise a mixture that includes a monomer.

Additionally, some embodiments of the nanoimprint lithography system 100 have a dispenser pitch that is fixed in either or both of the x direction and the y direction, and some embodiments of the nanoimprint lithography system 100 have a dispenser pitch that is not fixed in either of the x direction and the y direction. As used herein, the term "pitch" is a distance from the center of a feature to the center of an adjacent feature. Accordingly, a dispenser pitch is a distance from the center of a location where the nanoimprint lithography system 100 can dispense a drop 124 to the center of an adjacent location where the nanoimprint lithography system 100 can dispense a drop 124. In Cartesian coordinates, a two-dimensional pattern (a pattern as seen from a top view) can have a pitch in the x direction that corresponds to the distance between the centers of the features as measured in the x direction and can have a pitch in the y direction that corresponds to the distance between the centers of the features as measured in the y direction. And, in some embodiments of the nanoimprint lithography system 100, a y-direction dispenser pitch is fixed by a distance between centers of adjacent fluid-dispense ports 129, and therefore, the y-direction dispenser pitch is determined by the physical layout of the fluid-dispense ports 129 in the fluid-dispense head 127. The x-direction dispenser pitch may be the same as or different from the y-direction dispenser pitch. Also, the x-direction dispenser pitch may be based on the physical layout of the fluid-dispense ports 129 in the fluid-dispense head 127, on the physical capabilities of other members of the nanoimprint lithography system 100, or on software that controls the nanoimprint lithography system 100. For example, in some embodiments the x-direction dispenser pitch can be adjusted by controlling the relative velocity between the substrate 102 and the fluid-dispense ports 129 during dispensing when the fluid-drop-dispense rate (e.g., dispensings per millisecond) from the fluid-dispense ports 129 is known. As the relative velocity between the substrate 102 and the fluid-dispense ports 129 increases, the x direction dispenser pitch increases, and as the relative velocity between the substrate 102 and the fluid-dispense ports 129 decreases, the x-direction dispenser pitch decreases, assuming that the fluid-drop-dispense rate remains constant. Because in some embodiments (e.g., the embodiment in FIG. 2B) the y-direction dispenser pitch is dependent on the spacing and organization of the fluid-dispense ports 129, adjusting the y-direction dispenser pitch can be more challenging than adjusting the x-direction dispenser pitch. In some embodiments, the fluid-dispense ports 129 can be rotated while they remain in the fixed position relative to one another to achieve a variety of different y-direction dispenser pitches.

The drops 124 of formable material may be dispensed upon the substrate 102 before or after a desired field volume is defined between the patterning surface 112 and the substrate 102, depending on the embodiment. The field volume indicates the volume of formable material required to produce all of the desired features of the patterned layer 125 (e.g., all of the features of the patterned layer 125 in an imprint field). Different fluid dispensers 122 may use different technologies to dispense the drops 124. When the formable material is jettable, ink-jet-type fluid dispensers 122 may be used to dispense the drops 124 of formable material. For example, thermal ink jetting, microelectromechanical-systems-based (MEMS-based) ink jetting, and piezoelectric ink jetting are technologies for dispensing jettable liquids.

Furthermore, additional formable material may be added to the substrate 102 using various techniques, for example drop dispense, spin-coating, dip coating, chemical vapor deposition (CVD), physical vapor deposition (PVD), thin film deposition, thick film deposition, or the like.

The nanoimprint lithography system 100 also includes an energy source 126 that directs actinic energy along an exposure path 128. The imprint head 119 and the substrate positioning stage 107 may be configured to position the template 108 and the substrate 102 on (e.g., in superimposition with) the exposure path 128. A camera 136 may likewise be positioned such that an imaging field of the camera 136 is in superimposition with at least part of the exposure path 128.

Once the drops 124 of formable material have been deposited on the substrate, either the imprint head 119, the substrate positioning stage 107, or both varies a distance between the mesa 110 and the substrate 102 to define a desired field volume that is filled by the formable material. For example, the imprint head 119 may apply a force to the template 108 that moves the mesa 110 into contact with the drops 124 of formable material that are on the substrate 102. After the desired field volume is filled with the formable material, the energy source 126 produces energy (e.g., actinic radiation (UV)) that is directed along the exposure path 128 to the formable material and that causes the formable material to cure, solidify, or cross-link in conformance to a shape of the substrate surface 130 and the patterning surface 112, thereby defining a patterned layer 125 on the substrate 102. The formable material is cured while the template 108 is in contact with the formable material, thereby forming the patterned layer 125 on the substrate 102. Thus, the nanoimprint lithography system 100 uses an imprinting process to form the patterned layer 125, which has recesses and protrusions that are an inverse of the pattern in the patterning surface 112.

The imprinting process may be done repeatedly in a plurality of imprint fields (e.g., the imprint fields 141 in FIG. 2A) that are spread across the substrate surface 130. For example, each of the imprint fields may be the same size as the mesa 110 or the same size as only the pattern area of the mesa 110. The pattern area of the mesa 110 is a region of the patterning surface 112 that is used to imprint patterns on a substrate 102 (e.g., a region that includes the template recesses 114 and the template protrusions 116). The pattern area of the mesa 110 may include fluid control features that are used to prevent extrusions. In some embodiments, the substrate 102 has only one imprint field, and the imprint field is the same size as the substrate 102 or as the area of the substrate 102 which is to be patterned with the mesa 110.

Also, in some embodiments, the imprint fields overlap. Some of the imprint fields may be partial imprint fields that intersect a boundary of the substrate 102.

Figure 14A:
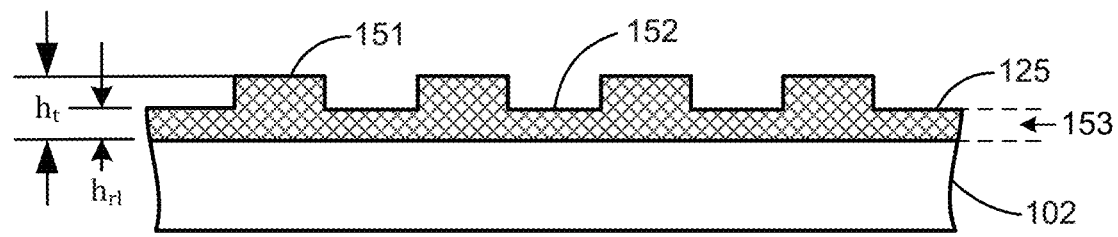
FIG. 14A illustrates an example embodiment of a residual layer.

The patterned layer 125 may be formed such that it has a residual layer that has a residual layer thickness (RLT). For example, FIG. 14A illustrates an example embodiment of a residual layer. The patterned layer 125 may also include one or more features, such as protrusions, that extend above the residual layer. These protrusions match the recesses 114 in the patterning surface 112 of the mesa 110.

The patterned layer 125 can be further subjected to known procedures and processes for article (e.g., device) fabrication, including, for example, curing, oxidation, layer formation, deposition, doping, planarization, etching, formable material removal, dicing, bonding, packaging, and the like. Examples of articles include CMOS logic, microprocessors, NAND Flash memory, NOR Flash memory, DRAM memory, MRAM, 3D cross-point memory, Re-RAM, Fe-RAM, STT-RAM, and MEMS.

Figure 14B:
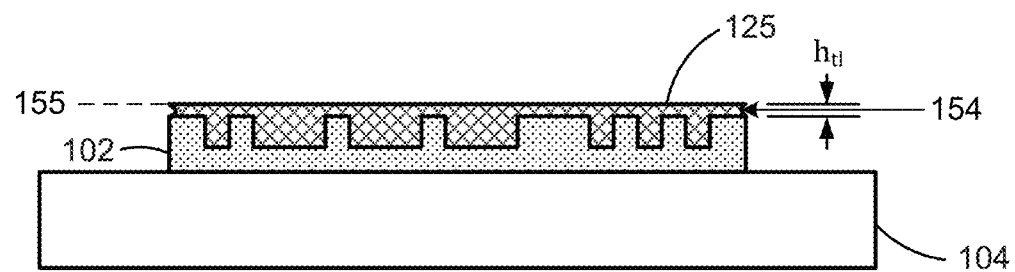
FIG. 14B illustrates an example embodiment of a top layer.

Also, in embodiments of the nanoimprint lithography system 100 that perform IAP, the substrate 102 may have a pattern on its surface, the drops of formable material 124 may form a patterned layer 125 that fills the pattern in the substrate 102, and the patterned layer 125 may have a top layer that extends above the substrate 102 and that has a top layer thickness (TLT). The upper surface of the top layer may be featureless and planar. For example, FIG. 14B illustrates an example embodiment of a top layer.

The nanoimprint lithography system 100 may be regulated, controlled, or directed by one or more processors 132 (e.g., controllers) in communication with one or more other components or subsystems, such as the substrate positioning stage 107, the imprint head 119, the fluid dispenser 122, the energy source 126, or the camera 136, and may operate based on instructions in a computer-readable program stored in one or more computer-readable storage media 134. In some embodiments, including the embodiment in FIG. 1, the one or more processors 132 and the one or more computer-readable storage media 134 are included in a nanoimprint-lithography-control device 135. The nanoimprint-lithography-control device 135 regulates, controls, or directs the operations of the nanoimprint lithography system 100.

Each of the one or more processors 132 may be or may include one or more of the following: a central processing units (CPU), which may include microprocessors (e.g., a single core microprocessor, a multi-core microprocessor); a graphics processing unit (GPUs); an application-specific integrated circuit (ASIC); a field-programmable-gate array (FPGA); a digital signal processors (DSP); a specially-configured computer; and other electronic circuitry (e.g., other integrated circuits). For example, a processor 132 may be a purpose-built controller or may be a general-purpose controller that has been specially-configured to be a nanoimprint-lithography-system controller.

Examples of computer-readable storage media include, but are not limited to, a magnetic disk (e.g., a floppy disk, a hard disk), an optical disc (e.g., a CD, a DVD, a Blu-ray), a magneto-optical disk, magnetic tape, semiconductor memory (e.g., a non-volatile memory card, flash memory, a solid-state drive, SRAM, DRAM, EPROM, EEPROM), a networked attached storage (NAS), an intranet-connected computer-readable storage device, and an internet-connected computer-readable storage device.

In the embodiment in FIG. 1, the nanoimprint-lithography-control device 135 may operate as a drop-pattern-generation device, which generates one or more drop patterns, and the nanoimprint-lithography-control device 135 may obtain the one or more drop patterns from another device (e.g., a drop-pattern-generation device) that generated the one or more drop patterns. For example, the one or more processors 132 may be in communication with a networked computer on which analysis is performed and control files, such as drop patterns, are generated. A drop pattern indicates where the fluid dispenser 122 should deposit drops 124 of liquid formable material onto the substrate 102. A drop pattern may be generated based, at least in part, on a field volume or on imprint-field features. Also, to account for imprint-field features, the drop density of the drop pattern may vary across the imprint field. And the drop pattern may have a uniform drop density over regions of the imprint field that have a uniform density (e.g., blank areas, or areas where the imprint-field features have a uniform feature density).

Figure 2A:
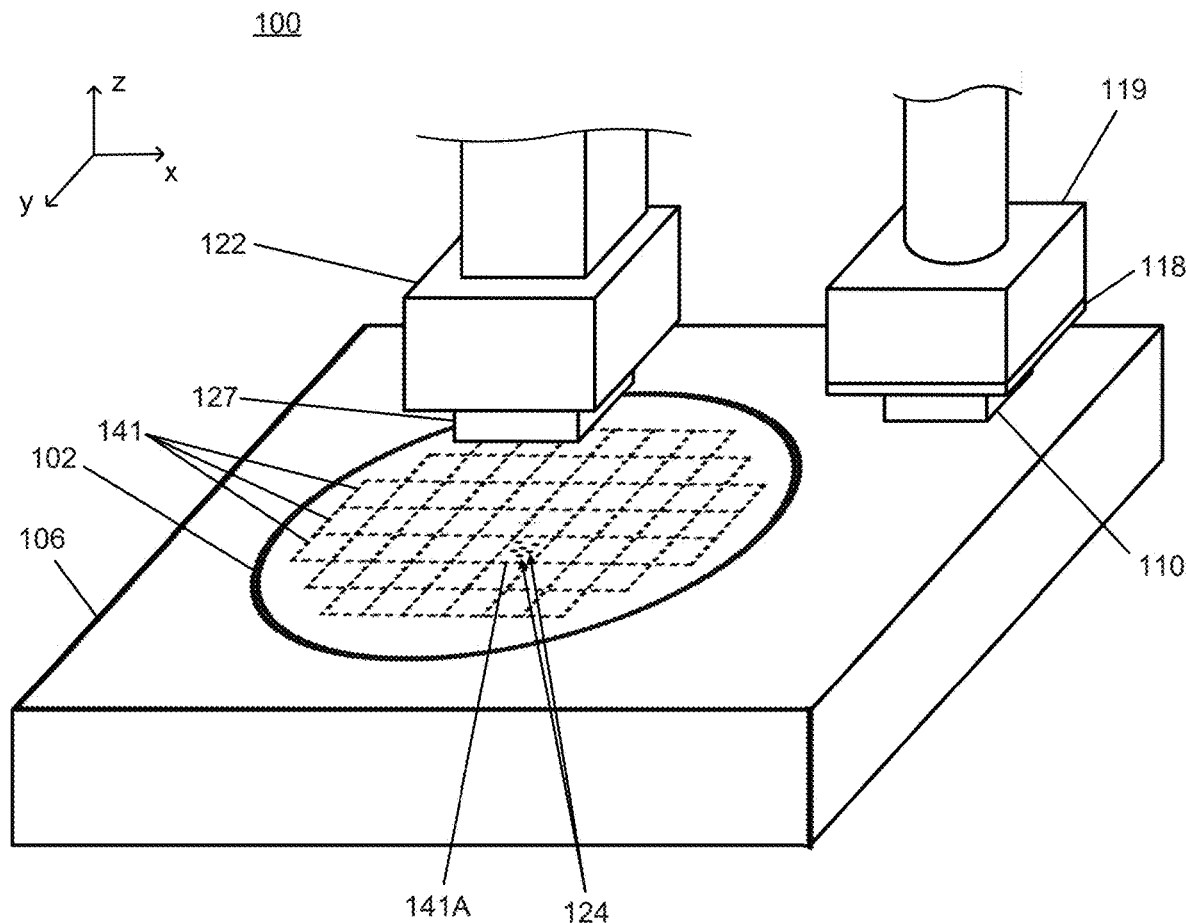
FIG. 2A illustrates a perspective view of an example embodiment of a nanoimprint lithography system.
Figure 2B:
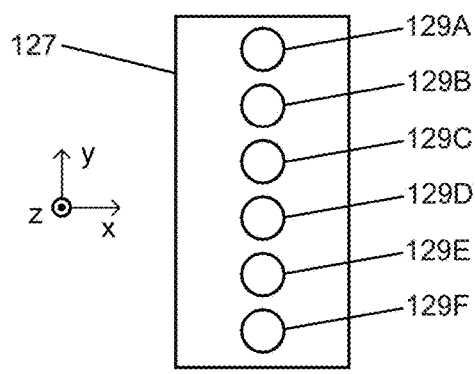
FIG. 2B illustrates an example embodiment of a fluid-dispense head and fluid-dispense ports.

FIG. 2A illustrates a perspective view of an example embodiment of a nanoimprint lithography system 100. This embodiment of a nanoimprint lithography system 100 includes a substrate 102, an applique 106, a fluid dispenser 122, a mesa 110, a template chuck 118, and an imprint head 119. Also, FIG. 2A illustrates a plurality of imprint fields 141 on the substrate 102. Additionally, the fluid dispenser 122 has deposited drops 124 of formable material on an imprint fields 141A.

Figure 3:
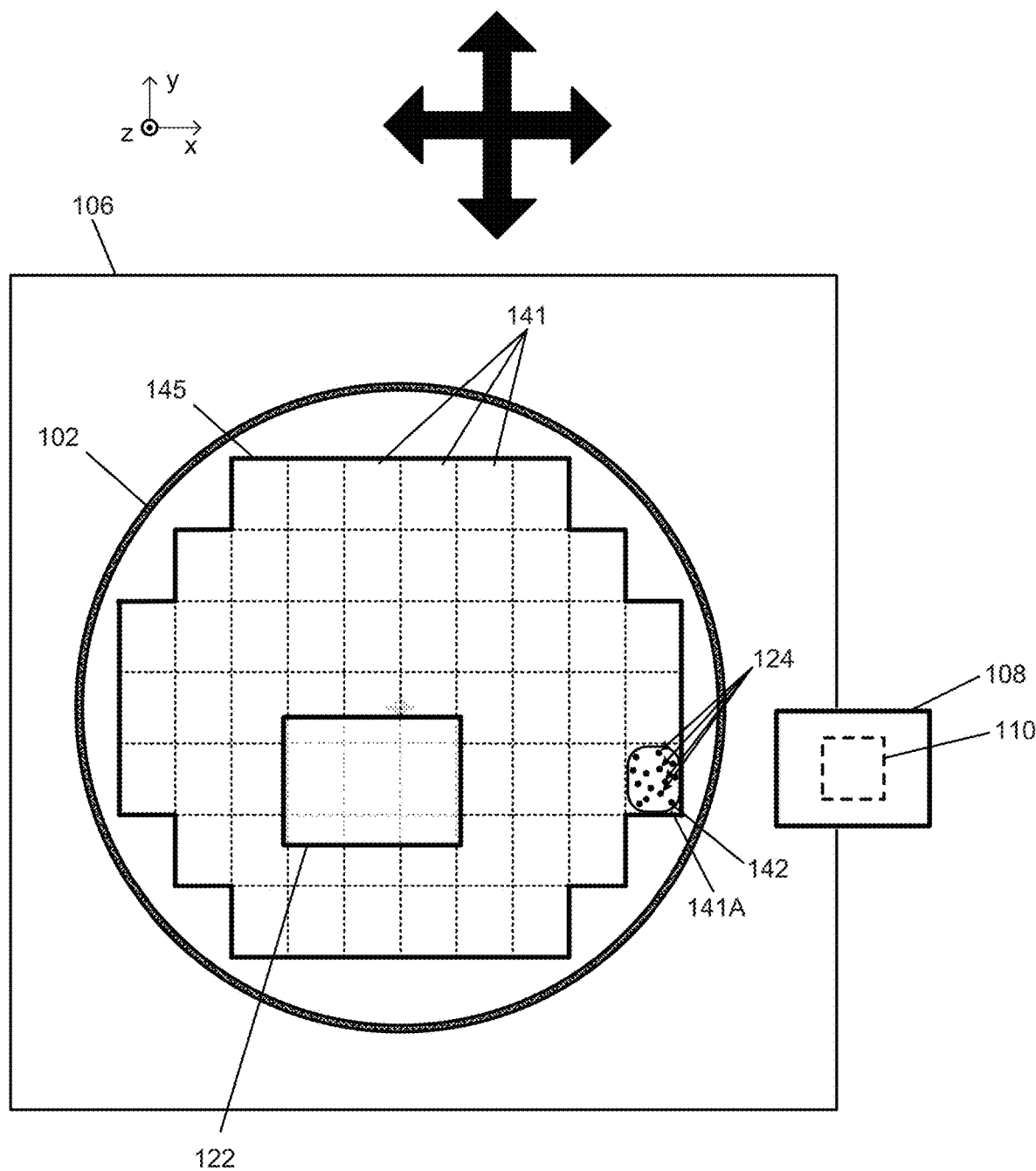
FIG. 3 illustrates a plan view (a view from along the z axis) of an example embodiment of a substrate, an applique, a fluid dispenser, a template, and a drop pattern.

FIG. 3 illustrates a plan view (a view from along the z axis) of an example embodiment of a substrate 102, an applique 106, a fluid dispenser 122, a template 108, and a drop pattern 142. The template 108 includes a mesa 110. A drop-pattern-generation field 145 on the substrate 102 may include a plurality of imprint fields 141. The drop-pattern-generation field 145 is the region of the substrate 102 on which drops 124 of formable material will be deposited. In some embodiments, the drop-pattern-generation field 145 has a different shape than the shape of the drop-pattern-generation field 145 illustrated in FIG. 3, and, in some embodiments, the drop-pattern-generation field 145 includes the entire substrate 102.

On each of the imprint fields 141, a respective layer may be formed from formable material (e.g., a patterned layer, a planar layer). The substrate positioning stage, that supports the applique 106 and the substrate 102, can move the applique 106 and the substrate 102 along both the x axis and the y axis. This allows the substrate positioning stage to position each of the imprint fields 141 under the fluid dispenser 122, which deposits drops of formable material on the imprint field 141, and then under the template 108, which forms a pattern (e.g., a patterned layer) in the formable material that was deposited on the imprint field 141. In some embodiments, there is only one imprint field 141 on the substrate surface.

When an imprint field 141 is positioned under the fluid dispenser 122, the fluid dispenser 122 can deposits drops 124 of formable material on the imprint field 141. For example, FIG. 3 shows an imprint field 141A on which drops 124 of formable material have been deposited by the fluid dispenser 122 according to a drop pattern 142. In some embodiments, the fluid dispenser 122 deposits the drops 124 on each of the imprint fields 141 according to the same drop pattern 142. However, in some embodiments, the fluid dispenser 122 uses different drop patterns for some of the imprint fields 141.

Figure 4:
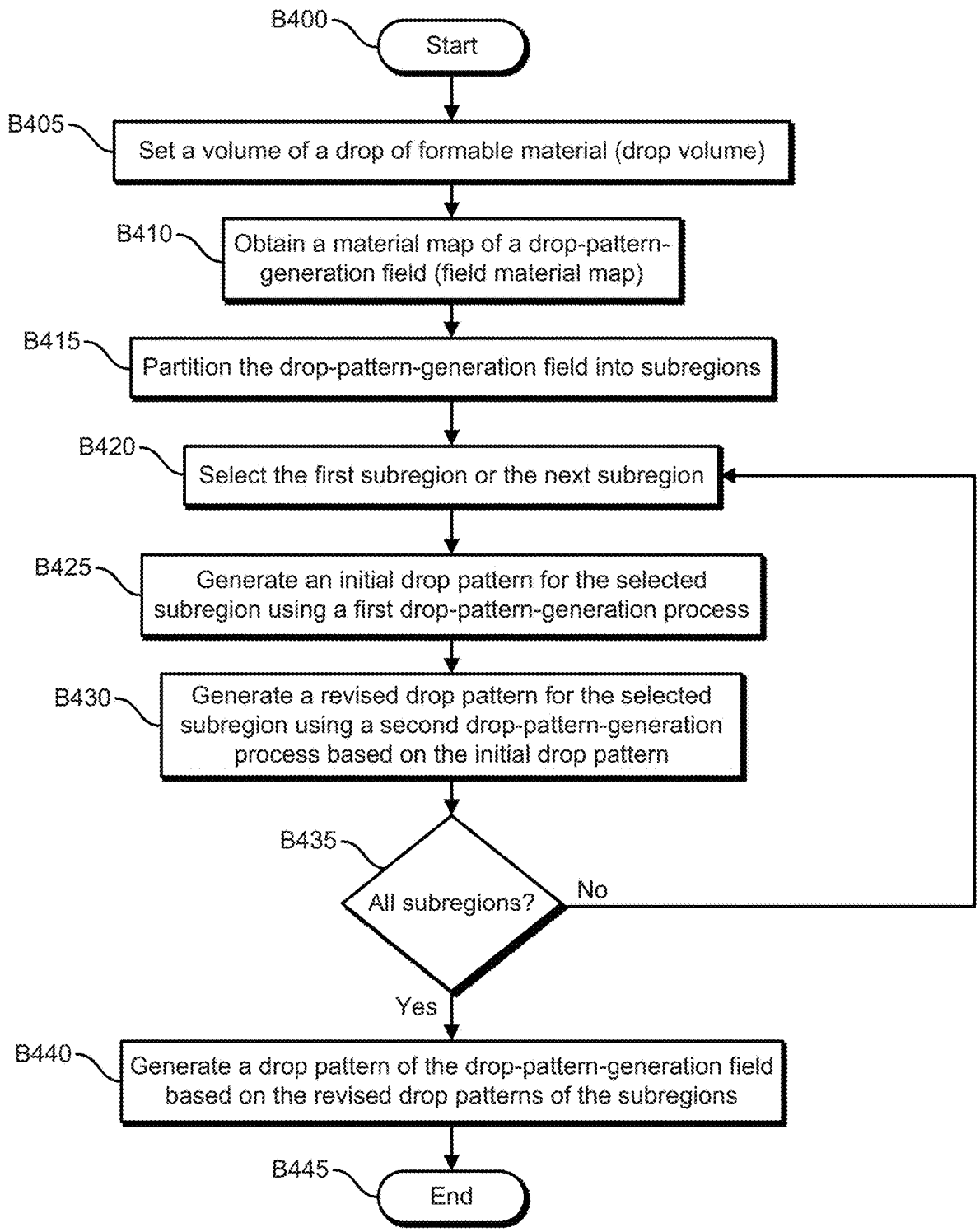
FIG. 4 illustrates an example embodiment of an operational flow for generating a drop pattern.

FIG. 4 illustrates an example embodiment of an operational flow for generating a drop pattern. Although this operational flow and the other operational flows that are described herein are each presented in a certain respective order, some embodiments of these operational flows perform at least some of the operations in different orders than the presented orders. Examples of different orders include concurrent, parallel, overlapping, reordered, simultaneous, incremental, and interleaved orders. Also, some embodiments of these operational flows include operations (e.g., blocks) from more than one of the operational flows that are described herein. Thus, some embodiments of the operational flows may omit blocks, add blocks (e.g., include blocks from other operational flows that are described herein), change the order of the blocks, combine blocks, or divide blocks into more blocks relative to the example embodiments of the operational flows that are described herein.

Furthermore, although this operational flow and the other operational flows that are described herein are performed by a drop-pattern-generation device, some embodiments of these operational flows are performed by two or more drop-pattern-generation devices or by one or more other specially-configured computing devices (e.g., a nanoimprint-lithography-control device).

Figure 5:
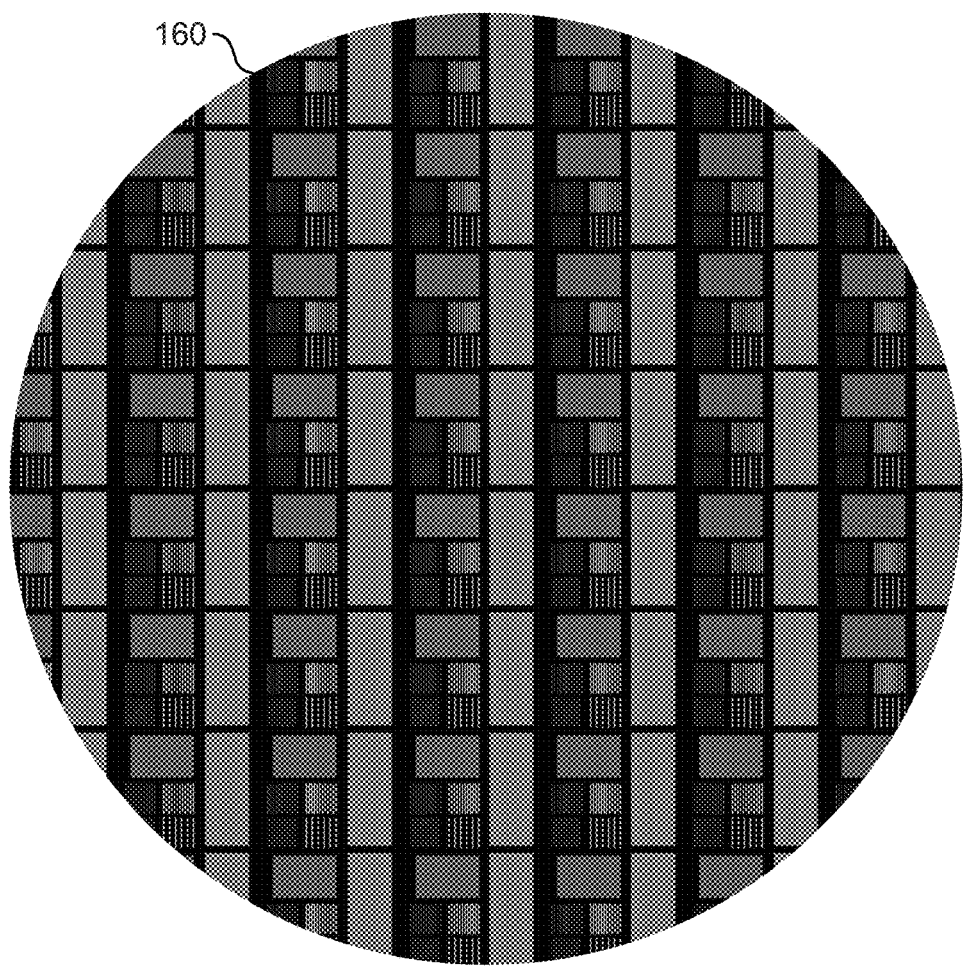
FIG. 5 illustrates an example embodiment of a field material map.

In FIG. 4, the flow starts in block B400 and then proceeds to block B405, where the drop-pattern-generation device sets or obtains (e.g., retrieves, receives) a volume of a drop of formable material (drop volume), which indicates the volume of formable material in a single drop. Depending on the components (e.g., fluid dispenser) of the corresponding nanoimprint lithography system, the drop volume may have a range of possible volumes (e.g., be adjustable), an adjustable set of possible volumes, or the drop volume may be a fixed volume. Next, in block B410, the drop-pattern-generation device obtains a material map of a drop-pattern-generation field (a field material map), which may include one or more imprint fields and which may define a field volume. The field material map may cover an entire substrate or may cover only part of a substrate. For example, a field material map may be an image (e.g., bitmap, PNG) in which the respective value of each tile (e.g., pixel, voxel) indicates a volume of imprint material (e.g., a volume of a patterned layer, such as the patterned layer 125 in FIG. 1) or may be generated based on layout data, such as GDSII data or OASIS data. FIG. 5 illustrates an example embodiment of a field material map 160. The different shades in the field material map 160 indicate the respective volumes of imprint material at the locations of the tiles.

Next, in block B415, the drop-pattern-generation device partitions the drop-pattern-generation field into a plurality of subregions. For example, in some embodiments, no subregion overlaps any other subregion (the subregions are non-overlapping). Also, collectively the subregions may cover the entire drop-pattern-generation field (i.e., the union of the subregions includes the entire drop-pattern-generation field). Thus, there may not be any gaps between subregions, and each subregion may abut (e.g., share one or more boundaries with) one or more other subregions.

Figure 6:
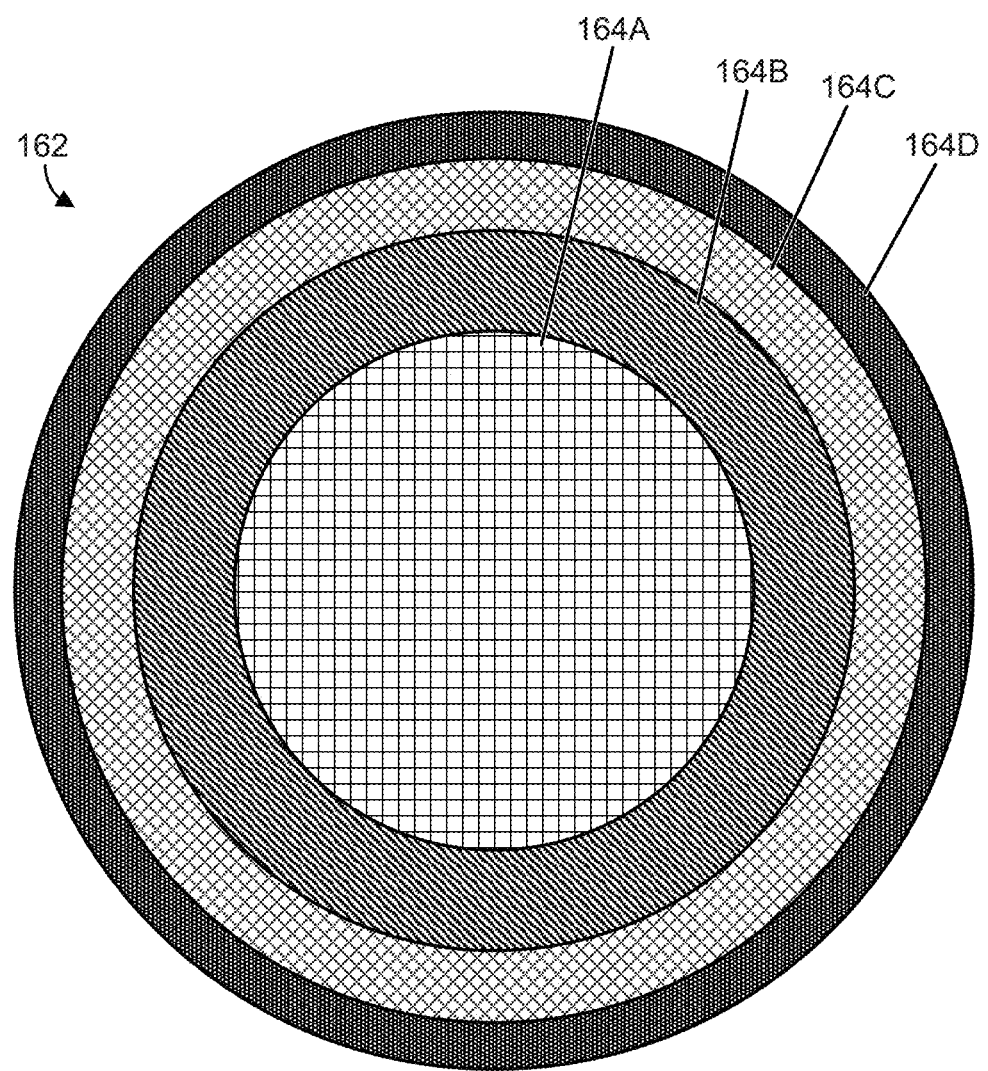
FIG. 6 illustrates an example embodiment of a drop-pattern-generation field and a plurality of subregions.

In some embodiments, all of the subregions have the same size and shape, and, in some embodiments, at least some of the subregions have different sizes and shapes. Furthermore, the sizes and shapes of the subregions may be different than the sizes and shapes of the imprint fields 141. For example, FIG. 6 illustrates an example embodiment of a drop-pattern-generation field 162 and a plurality of subregions 164. In FIG. 6, the subregions have different sizes and shapes: one of the subregions 164 is circular, and the other three subregions 164 are annular.

Also, a minimum size of a dimension (e.g., length, width, radius) of a subregion may be based on (e.g., be a multiple of) one of more dispenser pitches of a nanoimprint lithography system. For example, a minimum size of a dimension of a subregion may be two, three, or ten dispenser pitches. Additionally, the speed with which blocks B425-B430 can be performed may increase as the sizes of the subregions decrease, for example in embodiments where the second drop-pattern-generation process has a quadratic runtime (e.g., a runtime that increases according to the square of the number of drops in a subregion).

Then, in block B420, the drop-pattern-generation device selects the first subregion (in the first iteration of block B420) or the next subregion (in iterations of block B420 that follow the first iteration of block B420). The order by which the subregions are selected may vary. For example, in some embodiments the order is based on one or more of the following: the shapes of the subregions, the spatial relationships of the subregions, the computing environment, and user input. To select a subregion, the drop-pattern-generation device may apply a mask to the drop-pattern-generation field that covers everything but the selected subregion.

The flow then proceeds to block B425, where the drop-pattern-generation device generates an initial drop pattern for the selected subregion using a first drop-pattern-generation process. The first drop-pattern-generation process may use the portion of the field material map that corresponds to the selected subregion as an input. The initial drop pattern may have a linear runtime (e.g., an O(n) runtime, where n is the area of the selected subregion or the number of drops in the selected subregion) and be non-iterative. For example, the first drop-pattern-generation process may be one of the drop-pattern-generation processes that is described in U.S. application Ser. No. 16/906,805 or in U.S. application Ser. No. 16/912,495, which are incorporated by reference herein.

Then, in block B430, the drop-pattern-generation device generates a revised drop pattern for the selected subregion using a second drop-pattern-generation process based on the initial drop pattern. The second drop-pattern-generation process may use the initial drop pattern as a starting drop pattern and then modify (e.g., revise, refine, optimize) the initial drop pattern. The second drop-pattern-generation process may be iterative and may have a non-linear runtime. For example, the second drop-pattern-generation process may have a quadratic runtime (e.g., an $O(n^2)$ runtime, where n is the area of the selected subregion or the number of drops in the selected subregion) or a runtime that is greater than a quadratic runtime. Also for example, the second drop-pattern-generation process may be one of the drop-pattern-generation processes that is described in U.S. Pat. No. 8,119,052, which is incorporated by reference. Additionally, starting with the initial drop pattern that was generated by the first drop-pattern-generation process may further increase the speed of the second drop-pattern-generation process because the second drop-pattern-generation process may be starting with a better (e.g., more optimal) drop pattern.

The uniformity of the RLT and the uniformity of the TLT (RLT/TLT uniformity) of the drop patterns that are produced by the first drop-pattern-generation process are usually not as good as the RLT/TLT uniformity of the drop patterns that are produced by the second drop-pattern-generation process. When an area (e.g., a drop-pattern-generation field, an imprint field) has RLT/TLT uniformity, the distance from the upper surface of the substrate to the upper surface of the cured formable material is the same everywhere in the area. However, the first drop-pattern-generation process can be performed more quickly than the second drop-pattern-generation process.

Next, in block B435, the drop-pattern-generation device determines whether a respective revised drop pattern has been generated for each subregion. If the drop-pattern-generation device determines that a respective revised drop pattern has not been generated for each subregion (B435=No), then the flow returns to block B420. If the drop-pattern-generation device determines that a respective revised drop pattern has been generated for each subregion (B435=Yes), then the flow proceeds to block B440.

In block B440, the drop-pattern-generation device generates a drop pattern of the entire drop-pattern-generation field based on the revised drop patterns of the subregions. For example, the drop-pattern-generation device may form the drop pattern of the entire drop-pattern-generation field by joining all of the revised drop patterns of the subregions, and each of the revised drop patterns may occupy the same location in the drop pattern that the respective subregions occupy in the drop-pattern-generation field. Finally, the flow ends in block B445.

In one example embodiment, the drop-pattern-generation field is circular and has a diameter of approximately 300 mm. Also, the field material map has many subfields, dies, and cells (e.g., as shown in FIG. 5). In block B415, the drop-pattern-generation device partitions the circular drop-pattern-generation field into subregions, for example into the subregions 164 that are illustrated in FIG. 6. FIG. 6 includes a circular subregion 164A that is centered at the center of the drop-pattern-generation field (which may have a diameter that is 10% of the drop-pattern-generation field's diameter, although this is not to scale in FIG. 6) and concentric, annular subregions 164B-D that are centered on the circular subregion 164A.

In block B420, the drop-pattern-generation device selects the first subregion, which is the circular subregion (e.g., subregion 164A in FIG. 6) in this example. For example, the drop-pattern-generation device may use a mask to exclude the areas of the drop-pattern-generation field that are not included in the circular subregion.

Then, in block B425, the drop-pattern-generation device generates an initial drop pattern (DP1A) for the circular subregion (e.g., subregion 164A in FIG. 6) using a first drop-pattern-generation process. Next, in block B430, the drop-pattern-generation device generates a revised drop pattern (DP1B) for the circular subregion using a second drop-pattern-generation process that uses the initial drop pattern (DP1A) as a starting drop pattern and then modifies the initial drop pattern, thereby producing the revised drop pattern (DP1B). The revised drop pattern (DP1B) of the circular subregion may be similar or identical to the drop pattern that would have been generated for the circular subregion had the drop-pattern-generation device performed the second drop-pattern-generation process on the entire drop-pattern-generation field without performing the first drop-pattern-generation process (for example, had the drop-pattern-generation device performed the second drop-pattern-generation process using a random drop pattern as a starting drop pattern).

Next, in block B435, the drop-pattern-generation device determines that a respective revised drop pattern has not been generated for each subregion, and the flow returns to block B420, where the drop-pattern-generation device selects the subregion that is a circular annulus that shares a border with the circular subregion (e.g., subregion 164B in FIG. 6). The subregion may have a thickness that is 4.2% of the drop-pattern-generation field's diameter (which is not to scale in FIG. 6). This thickness makes the computational load of the iterations of blocks B425-B430 similar to that of the first iteration of blocks B425-B430 because the two subregions (the central circle and the annulus) have approximately the same area.

To select the annular subregion, the drop-pattern-generation device may apply a mask to the drop-pattern-generation field that is shaped like an annulus that has two concentric circles centered at the drop-pattern-generation field's center and with radii equal to the inner and outer radius of the annular subregion. In some embodiments, in which successive masks are overlaid on each other, a mask convention is used in which subregions that are intersected by mask geometries an even number of times (including 0 times) are hidden and those intersected an odd number of times are visible.

The drop-pattern-generation device then performs blocks B425-B430 on the selected subregion, thereby generating an initial drop pattern (DP2A) and a revised drop pattern (DP2B) for the selected subregion. In this example, during blocks B425-B430, the revised drop pattern (DP1B) for the circular region (subregion 164A in FIG. 6) is unchanged.

The drop-pattern-generation device then performs blocks B420-B430 for the remaining subregions. In each iteration of blocks B420-B430, the drop-pattern-generation device selects an adjacent annular subregion (for example a larger annular subregion that encircles the subregions for which revised drop patterns have been generated in the preceding iterations), thereby generating additional initial drop patterns (DP3A, DP4A, etc.) and revised drop patterns (DP3B, DP4B, etc.) until the entire circular drop-pattern-generation field is covered.

This operational flow and the other operational flows that are described herein may substantially increase the speed with which the drop-pattern-generation device can generate a drop pattern. For example, in some embodiments, performing the second drop-pattern-generation process on a subregion (shaped like a ring) of a full wafer with a radius r of 149 mm and a thickness of 1 mm (having an area of 936 mm$^2$) versus performing the second drop-pattern-generation process for the wafer up to its edge (a radius of 150 mm and an area of 70,686 mm$^2$), assuming a quadratic runtime, makes the runtime in the second case 5700 times longer per iteration than the first case. Repeating the revised-drop-pattern generation for all ring-shaped subregions down to the center circular subregion of the wafer (150 rings in total, 1 mm thickness each), and accounting for the shorter runtimes of the smaller rings (which have smaller areas), the drop-pattern generation for the entire drop-pattern-generation field is 75× faster (versus performing the second drop-pattern-generation process for the entire drop-pattern-generation field).

Also for example, in some embodiments a 300 mm circular drop-pattern-generation field is partitioned into 150 subregions that are in the shapes of concentric rings, with a central circle. Assuming m iterations of the second drop-pattern-generation process, then the runtime of performing the second drop-pattern-generation process on the entire wafer is $km(\pi 150^2)^2$=5E9 km, where k is the runtime of one iteration. In contrast, the runtime of the hybrid process in FIG. 4 would be $T1+4$ $km\pi^2$ $(1^2)[\frac{1}{16}+149(1^2)+(1)\Sigma_{r=1}^{149}r+\Sigma_{r=1}^{149}r^2]$=T1+1.4E7 km, where T1 is the runtime of the first drop-pattern-generation process. Thus, the hybrid run time is less than 0.28% of the non-hybrid run time.

Figure 7:
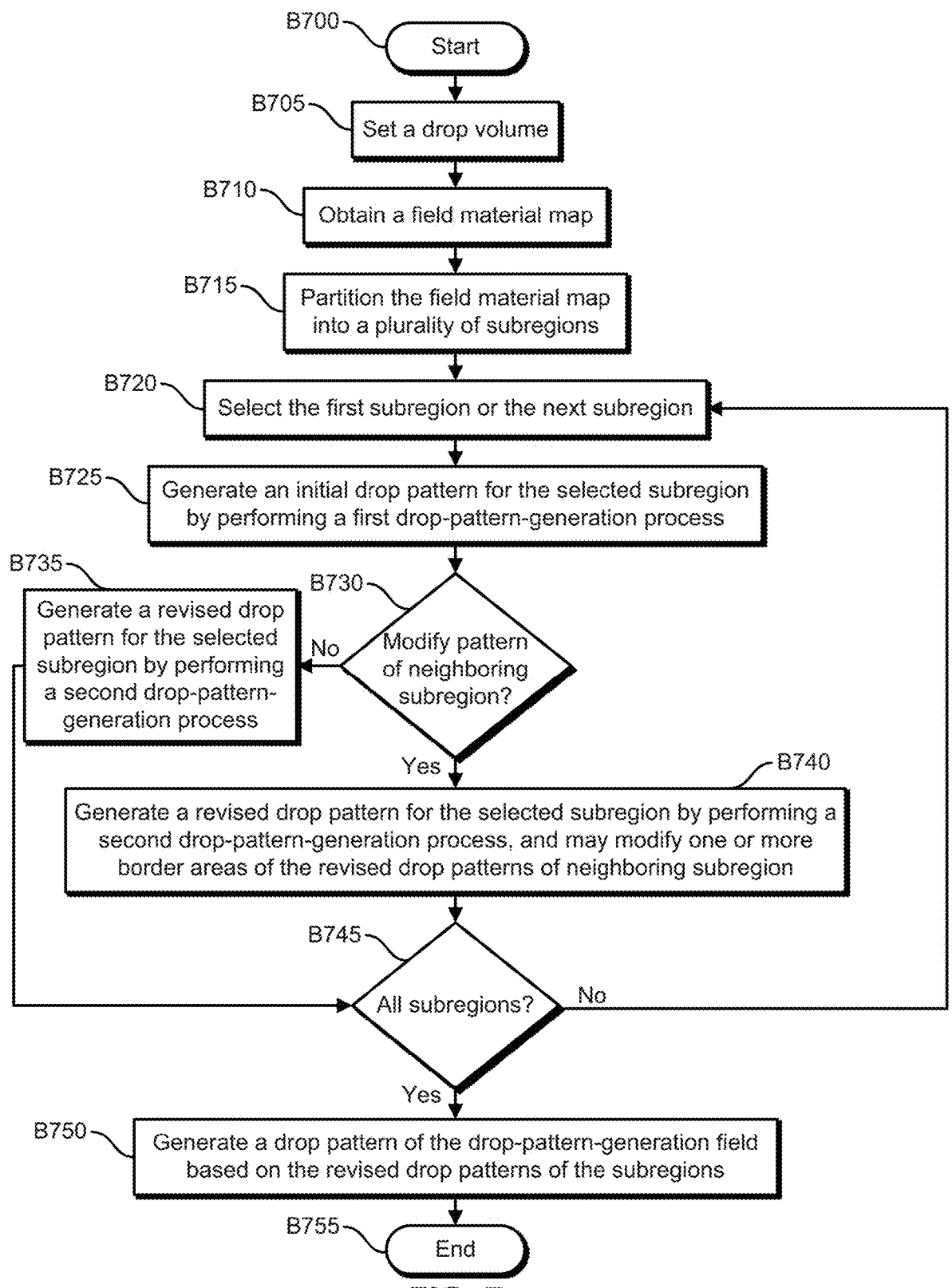
FIG. 7 illustrates an example embodiment of an operational flow for generating a drop pattern.

FIG. 7 illustrates an example embodiment of an operational flow for generating a drop pattern. The flow starts in block 700 and then proceeds to block B705, where a drop-pattern-generation device sets or obtains a drop volume. Next, in block B710, the drop-pattern-generation device obtains a field material map. Then, in block B715, the drop-pattern-generation device partitions the field material map into a plurality of subregions.

The flow then moves to block B720, where the drop-pattern-generation device selects the first subregion of the plurality of subregions. The flow then proceeds to block B725, where the drop-pattern-generation device generates an initial drop pattern for the selected subregion by performing a first drop-pattern-generation process. The first drop-pattern-generation process may use the portion of the field material map that corresponds to the selected subregion as an input.

Next, in block B730, the drop-pattern-generation device determines whether to modify one or more border areas of the revised drop patterns of neighboring subregions. For example, the drop-pattern-generation device may determine whether a setting has been set (e.g., by a user, by a software application, by a machine-learning model) to allow the modification of one or more border areas of the revised drop patterns of neighboring subregions, or the drop-pattern-generation device may determine whether any revised drop patterns of neighboring subregions have been generated. If the drop-pattern-generation device determines not to modify one or more border areas of the revised drop patterns of neighboring subregions (B730=No), then the flow moves to block B735. If the drop-pattern-generation device determines to modify one or more border areas of the revised drop patterns of neighboring subregions (B730=Yes), then the flow advances to block B740.

In block B735, the drop-pattern-generation device generates a revised drop pattern for the selected subregion by performing a second drop-pattern-generation process. The second drop-pattern-generation process may use the initial drop pattern and the portion of the field material map that corresponds to the selected subregion as inputs. From block B735, the flow moves to block B745.

In block B740, the drop-pattern-generation device generates a revised drop pattern for the selected subregion by performing a second drop-pattern-generation process. And the drop-pattern-generation device may modify one or more border areas of the revised drop patterns of neighboring subregions. A border area may be defined by distance (e.g., 20 μm, 50 μm, 100 μm, 200 μm, 300 μm, 500 μm, 750 μm, 1,000 μm), or by a multiple of dispenser pitches (e.g., 2 dispenser pitches, 3 dispenser pitches, 5 dispenser pitches, 10 dispenser pitches, 20 dispenser pitches, 50 dispenser pitches, 80 dispenser pitches, 100 dispenser pitches). In some embodiments, the multiples are non-negative integers. Also, the border areas may be defined differently on different axes. For example, if border areas are defined by multiples of dispenser pitches, and if the y direction dispenser pitch is different from the x direction dispenser pitch, then the sizes of the border areas may be different. Furthermore, the drop-pattern-generation device may modify the drop locations in the border areas such that the distance between a drop location in the border areas and the nearest drop location in the selected subregion is a multiple of the dispenser pitch.

The second drop-pattern-generation process may use at least the initial drop pattern, the one or more respective border areas of the revised drop patterns of the neighboring subregions, and the portion of the field material map that corresponds to the subregion and the border areas as inputs. From block B740, the flow moves to block B745.

In block B745, the drop-pattern-generation device determines whether a respective revised drop pattern has been generated for each subregion. If the drop-pattern-generation device determines that a respective revised drop pattern has not been generated for each subregion (B745=No), then the flow returns to block B720, where the drop-pattern-generation device selects the next subregion. If the drop-pattern-generation device determines that a respective revised drop pattern has been generated for each subregion (B745=Yes), then the flow proceeds to block B750.

In block B750, the drop-pattern-generation device generates a drop pattern of the entire drop-pattern-generation field based on the revised drop patterns of the subregions. Finally, the flow ends in block B755.

Figure 8:
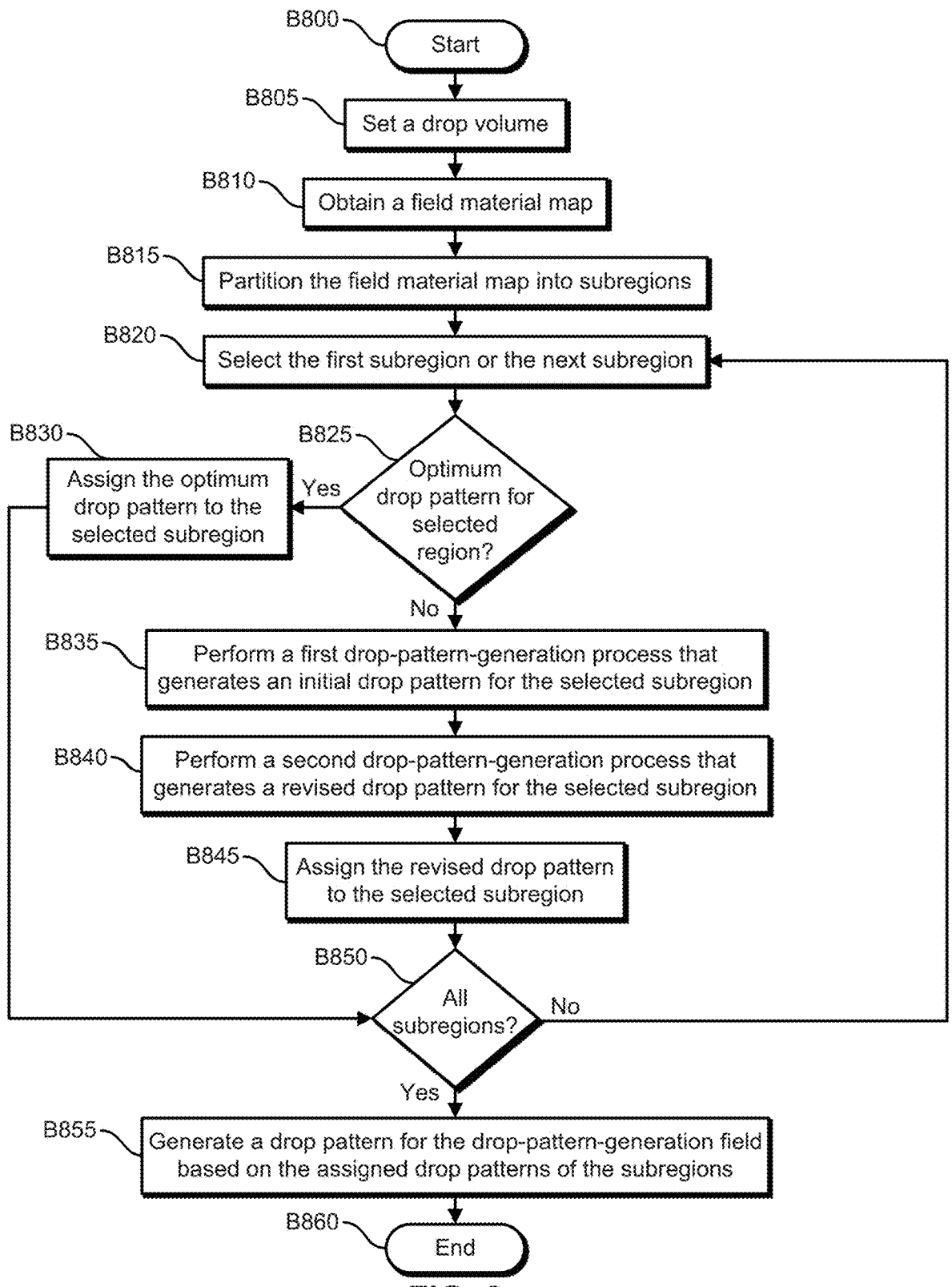
FIG. 8 illustrates an example embodiment of an operational flow for generating a drop pattern.

FIG. 8 illustrates an example embodiment of an operational flow for generating a drop pattern. The flow starts in block 800 and then proceeds to block B805, where a drop-pattern-generation device sets or obtains a drop volume. Next, in block B810, the drop-pattern-generation device obtains a field material map. Then, in block B815, the drop-pattern-generation device partitions the field material map into a plurality of subregions. The flow then moves to block B820, where the drop-pattern-generation device selects the first subregion of the plurality of subregions (in the first iteration of block B820) or the next subregion (in subsequent iterations of block B820).

The flow then advances to block B825, where the drop-pattern-generation device determines whether an optimum drop pattern is already available for the selected subregion. For example, if the subregion is a featureless region or blank region, then a grid drop pattern may be optimal for the subregion. Some embodiments of the drop-pattern-generation device search one or more databases for an optimum drop pattern for the selected subregion. If the drop-pattern-generation device determines that an optimum drop pattern is already available for the selected subregion and is able to obtain the optimum drop pattern, then the flow moves to block B830. In block B830, the drop-pattern-generation device assigns the optimum drop pattern to the selected subregion, and then the flow moves to block B850.

If the drop-pattern-generation device determines that an optimum drop pattern is not already available for the selected subregion or the drop-pattern-generation device is unable to obtain the optimum drop pattern, then the flow advances to block B835.

In block B835, the drop-pattern-generation device performs a first drop-pattern-generation process that generates an initial drop pattern for the selected subregion. The first drop-pattern-generation process may use at least the portion of the field material map that corresponds to the selected subregion as an input. Next, in block B840, the drop-pattern-generation device performs a second drop-pattern-generation process that generates a revised drop pattern for the selected subregion. The second drop-pattern-generation process may use at least the initial drop pattern and the portion of the field material map that corresponds to the selected subregion as inputs. The flow then moves to block B845, where the drop-pattern-generation device assigns the revised drop pattern to the selected subregion. From block B845, the flow moves to block B850.

In block B850, the drop-pattern-generation device determines whether a respective drop pattern has been assigned to each subregion. If the drop-pattern-generation device determines that a respective drop pattern has not been assigned to each subregion (B850=No), then the flow returns to block B820. If the drop-pattern-generation device determines that a respective drop pattern has been assigned to each subregion (B850=Yes), then the flow proceeds to block B855.

In block B855, the drop-pattern-generation device generates a drop pattern for the entire drop-pattern-generation field based on the assigned drop patterns (revised drop patterns and optimum drop patterns) of the subregions. Finally, the flow ends in block B860.

Figure 9:
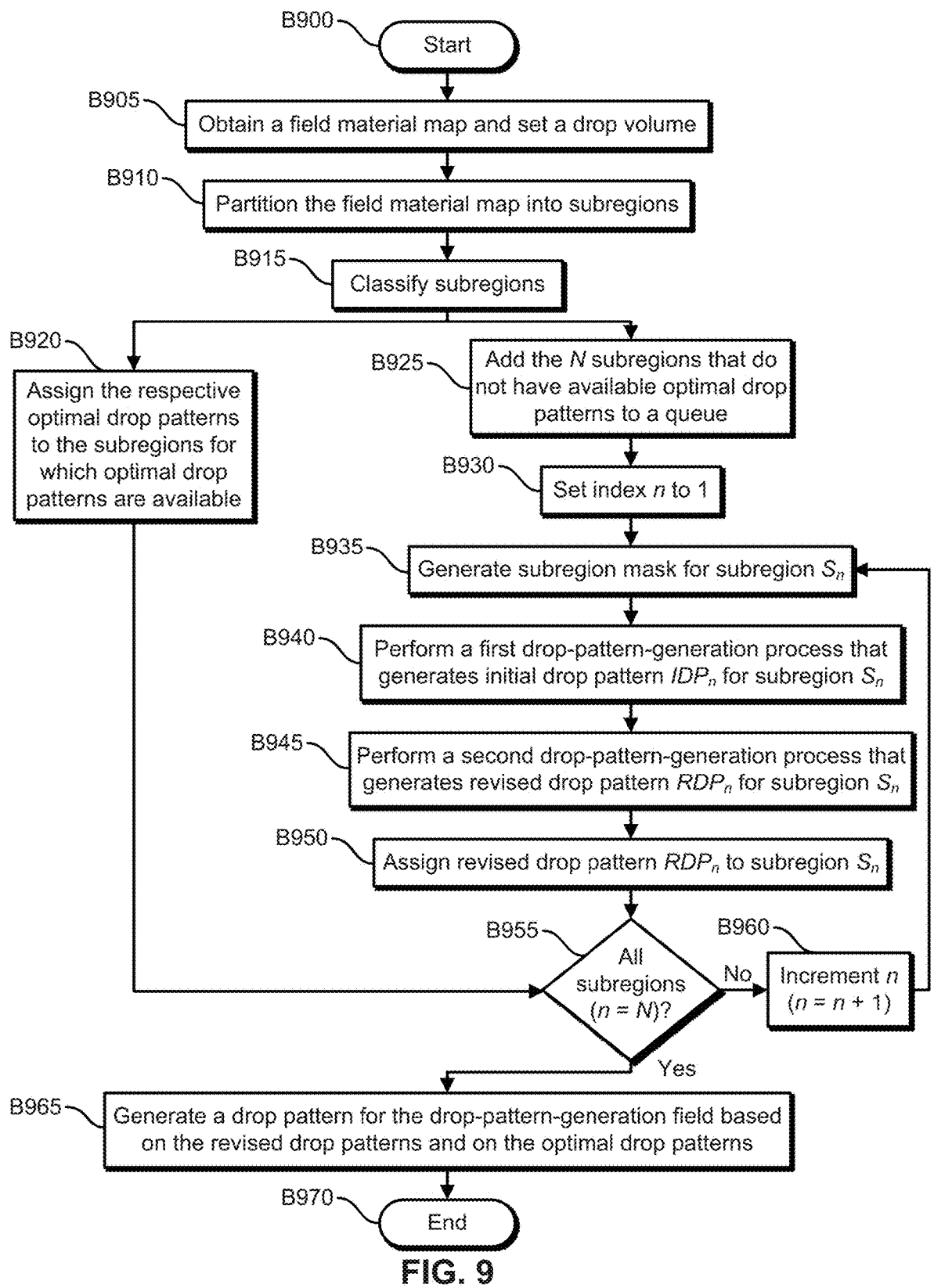
FIG. 9 illustrates an example embodiment of an operational flow for generating a drop pattern.
Figure 10:
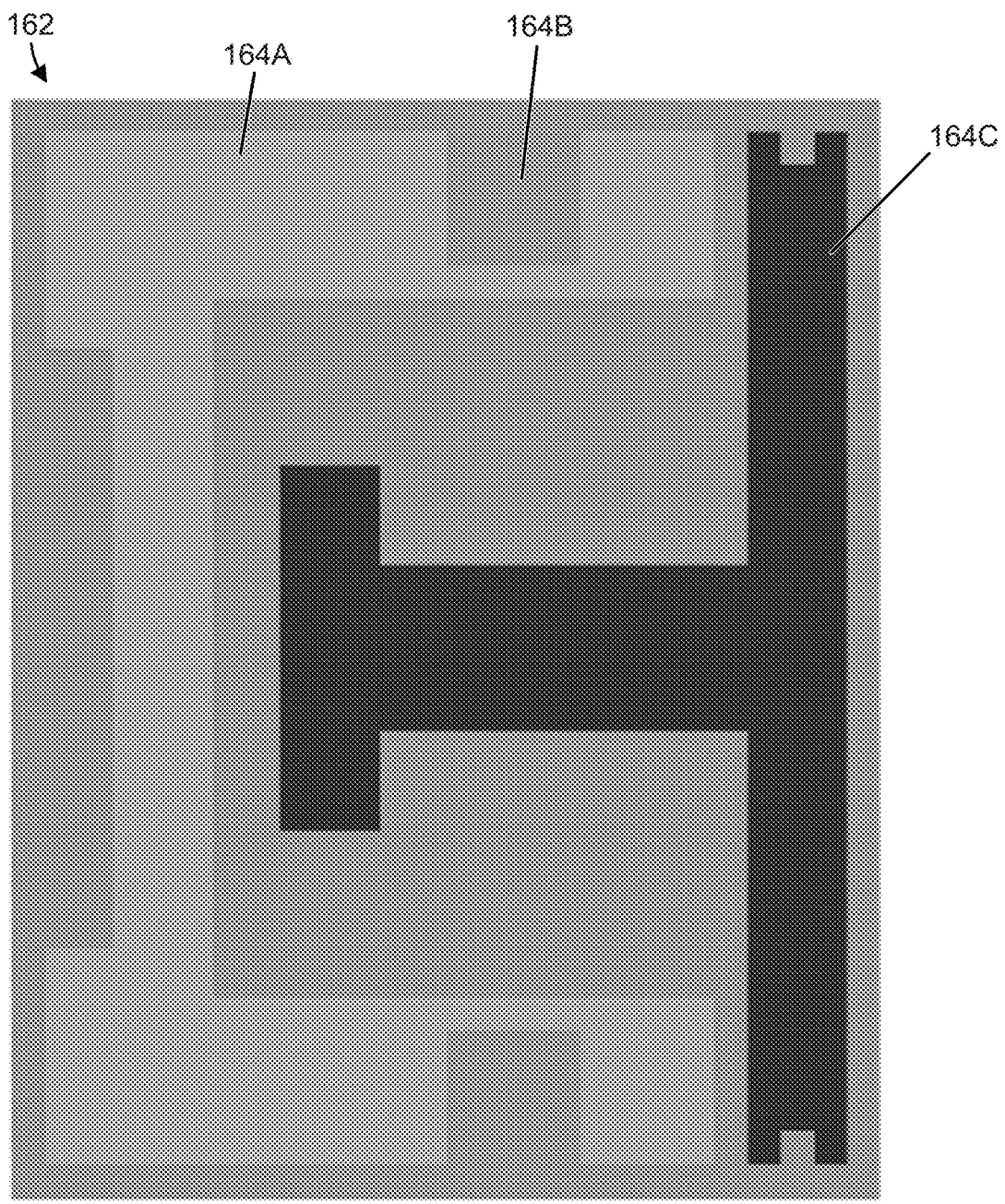
FIG. 10 illustrates an example embodiment of a drop-pattern-generation field and a plurality of subregions.
Figure 11:
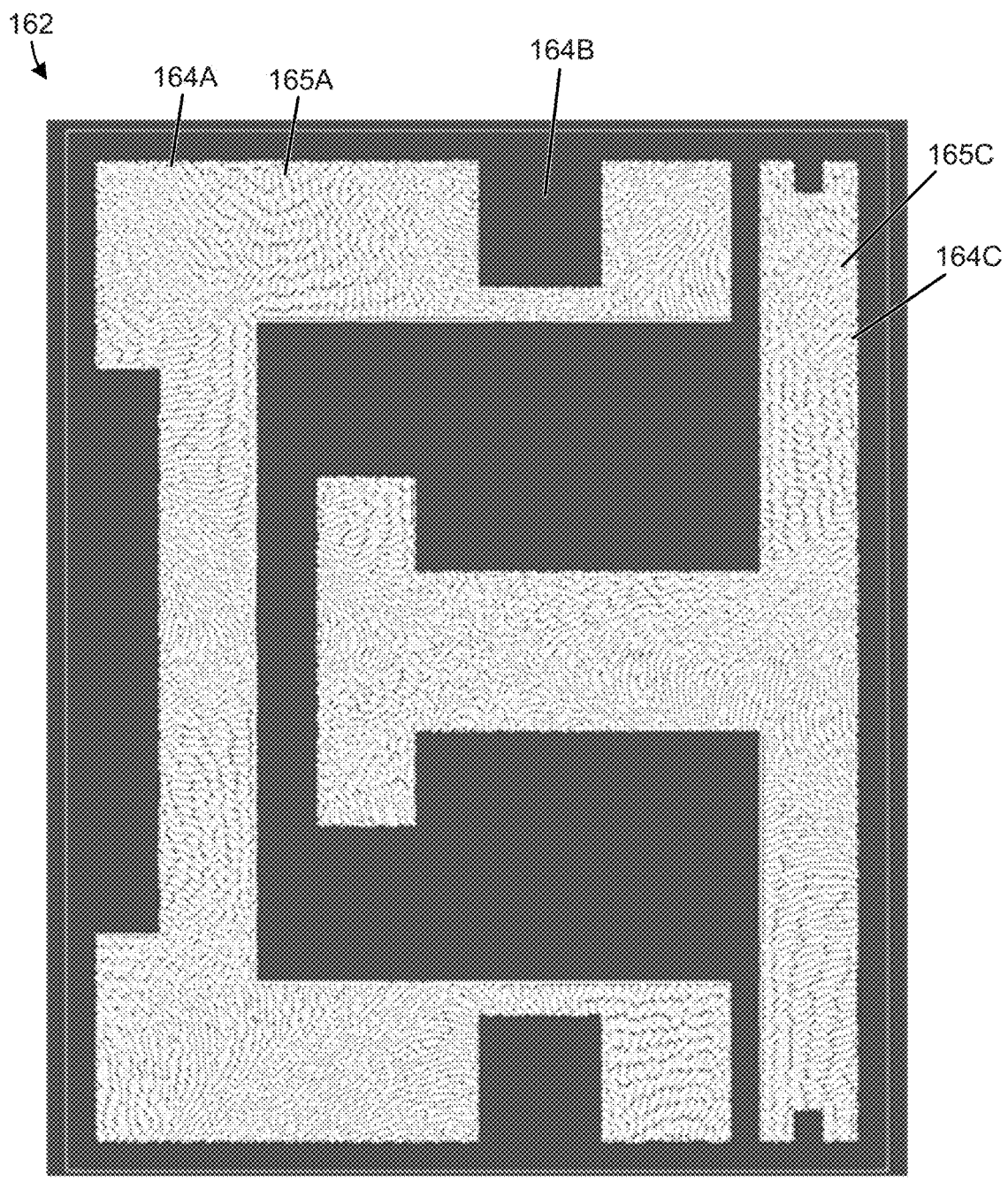
FIG. 11 illustrates example embodiments of optimal drop patterns for some of the subregions in FIG. 10.

FIG. 9 illustrates an example embodiment of an operational flow for generating a drop pattern. The flow starts in block 900 and then proceeds to block B905, where a drop-pattern-generation device obtains a field material map and sets a drop volume. Then, in block B910, the drop-pattern-generation device partitions the field material map into a plurality of subregions. The flow then moves to block B915, where the drop-pattern-generation device classifies each of the subregions as either (1) having an available optimal drop pattern or, alternatively, (2) not having an available optimal drop pattern. For example, FIG. 10 illustrates an example embodiment of a field material map 162 (for an entire drop-pattern-generation field) and a plurality of subregions 164. And, in this example, the drop-pattern-generation device determines that optimal drop patterns are available for subregions 164A and 164C, and thus classifies subregions 164A and 164C as (1) having an available optimal drop pattern. For example, FIG. 11 illustrates example embodiments of optimal drop patterns 165 for subregions 164A and 164C in FIG. 10. Drop pattern 165A is the optimal drop pattern for subregion 164A, and drop pattern 165C is the optimal drop pattern for subregion 164C. However, the drop-pattern-generation device determines that an optimal drop pattern is not available for subregion 164B, and thus classifies subregion 164B as (2) not having an available optimal drop pattern.

The flow then splits into a first flow and a second flow.

The first flow moves to block B920, where the drop-pattern-generation device assigns the respective optimal drop patterns to the subregions for which optimal drop patterns are available. Then the first flow proceeds to block B955, where the first flow rejoins the second flow.

Figure 12:
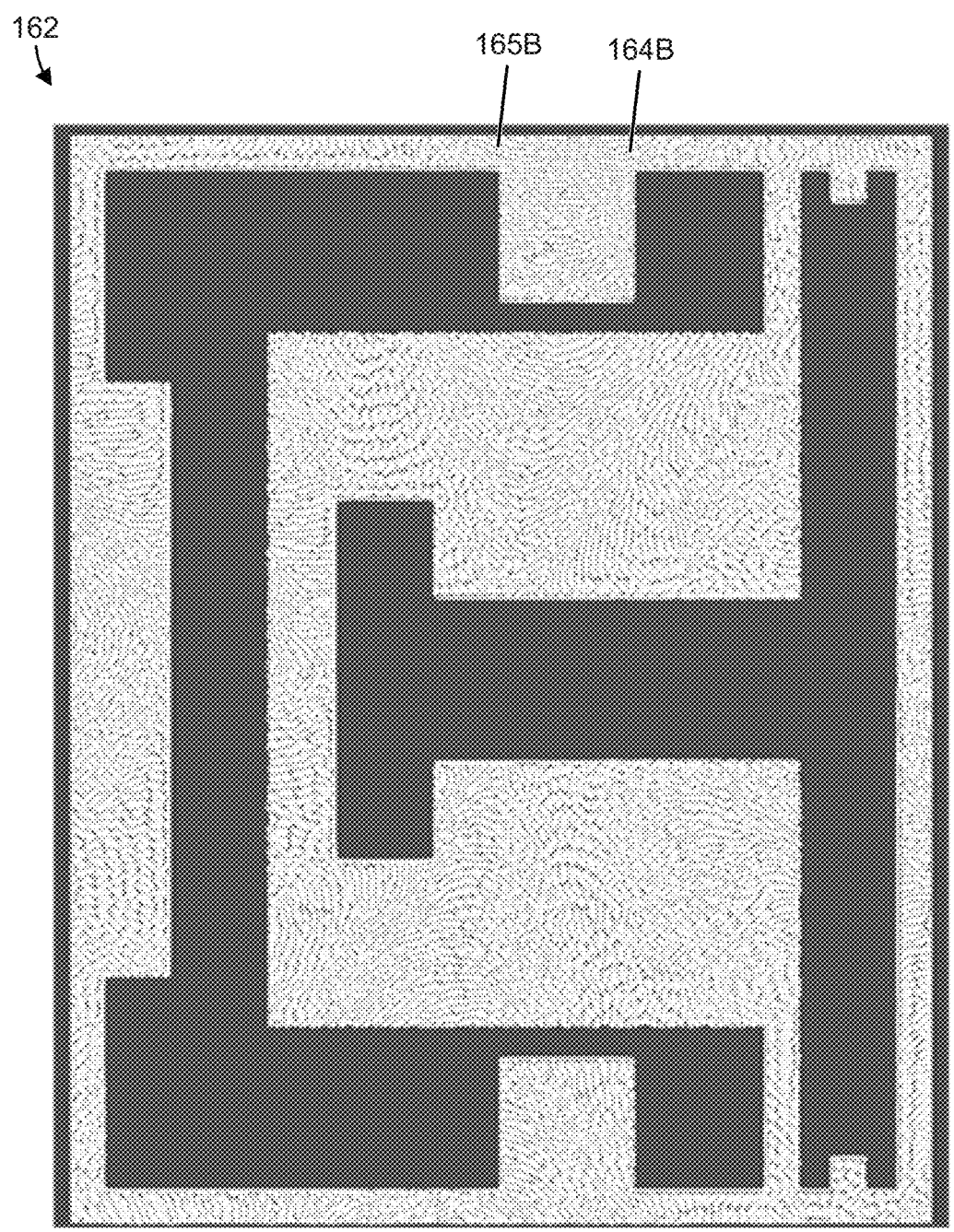
FIG. 12 illustrates an example embodiment of a revised drop pattern for a subregion in FIG. 10.

The second flow advances to block B925, where the drop-pattern-generation device adds the N subregions that do not have available optimal drop patterns to a queue. Next, in block B930, the drop-pattern-generation device sets index n to 1. Then, in block B935, the drop-pattern-generation device generates a subregion mask for subregion $S_n$ in the queue. The second flow then proceeds to block B940, where the drop-pattern-generation device performs a first drop-pattern-generation process that generates an initial drop pattern $IDP_n$ for subregion $S_n$. The second flow then moves to block B945, where the drop-pattern-generation device performs a second drop-pattern-generation process that generates a revised drop pattern $RDP_n$ for subregion $S_n$. And, in block B950, the drop-pattern-generation device assigns the revised drop pattern $RDP_n$ to subregion $S_n$. For example, FIG. 12 illustrates an example embodiment of a revised drop pattern 165B for subregion 164B in FIG. 10.

The second flow then advances to block B955, where the second flow rejoins the first flow and where the drop-pattern-generation device determines whether a revised drop pattern has been generated for each subregion in the queue. If the drop-pattern-generation device determines that a revised drop pattern has not been generated for each subregion in the queue (B955=No), then the flow proceeds to block B960. In block B960, the drop-pattern-generation device increases the index n by 1 (n=n+1), and then the second flow returns to block B935. If the drop-pattern-generation device determines that a revised drop pattern has been generated for each subregion in the queue (B955=Yes), then the second flow moves to block B965.

In block B965, the drop-pattern-generation device generates a drop pattern for the entire drop-pattern-generation field based on the revised drop patterns $RDP_n$ (for n=1 to N) and on the optimal drop patterns that have been assigned to the subregions. Finally, the flow ends in block B970.

Figure 13:
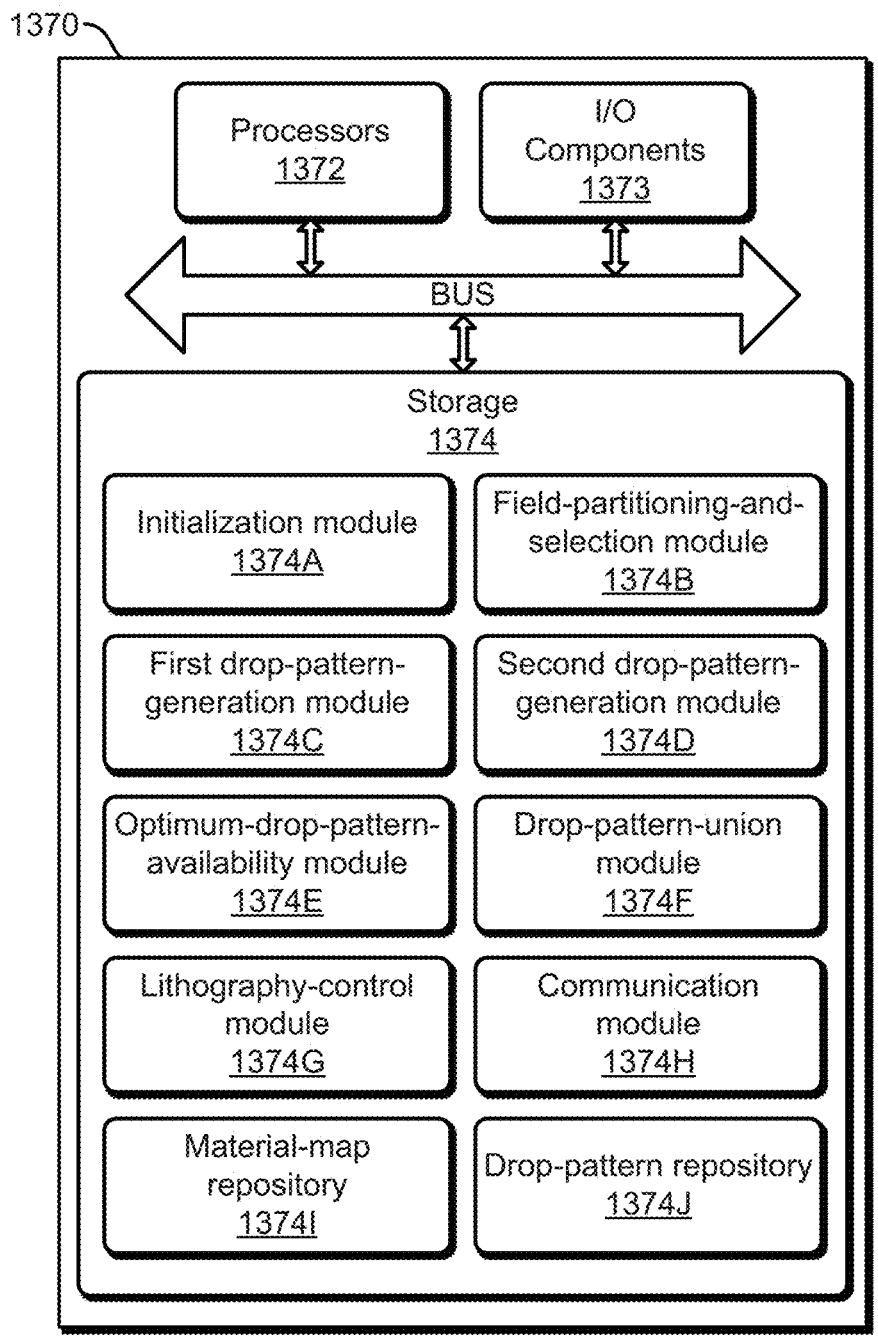
FIG. 13 illustrates an example embodiment of a drop-pattern-generation device.

FIG. 13 illustrates an example embodiment of a drop-pattern-generation device. The drop-pattern-generation device 1370 includes one or more processors 1372, one or more I/O components 1373, and storage 1374. Also, the hardware components of the drop-pattern-generation device 1370 communicate via one or more buses or other electrical connections. Examples of buses include a universal serial bus (USB), an IEEE 1394 bus, a Peripheral Component Interconnect (PCI) bus, a Peripheral Component Interconnect Express (PCIe) bus, an Accelerated Graphics Port (AGP) bus, a Serial AT Attachment (SATA) bus, and a Small Computer System Interface (SCSI) bus.

The one or more processors 1372 include one or more central processing units (CPUs), which may include microprocessors (e.g., a single core microprocessor, a multi-core microprocessor); one or more graphics processing units (GPUs); one or more tensor processing units (TPUs); one or more application-specific integrated circuits (ASICs); one or more field-programmable-gate arrays (FPGAs); one or more digital signal processors (DSPs); or other electronic circuitry (e.g., other integrated circuits). The I/O components 1373 may include communication components that communicate with one or more of the following: a substrate positioning stage, an imprint head, a fluid dispenser, an energy source, and a camera. Also, the I/O components 1373 may include communication components (e.g., a graphics card, a network-interface controller) that communicate with a network, a nanoimprint-lithography-control device, or with input or output devices (not illustrated), for example a display device, a keyboard, a mouse, a printing device, a touch screen, a light pen, an optical-storage device, a scanner, a microphone, a drive, a joystick, and a control pad.

The storage 1374 includes one or more computer-readable storage media. As used herein, a computer-readable storage medium includes an article of manufacture, for example a magnetic disk (e.g., a floppy disk, a hard disk), an optical disc (e.g., a CD, a DVD, a Blu-ray), a magneto-optical disk, magnetic tape, and semiconductor memory (e.g., a non-volatile memory card, flash memory, a solid-state drive, SRAM, DRAM, EPROM, EEPROM). The storage 1374, which may include both ROM and RAM, can store computer-readable data or computer-executable instructions.

The drop-pattern-generation device 1370 also includes an initialization module 1374A, a field-partitioning-and-selection module 1374B, a first drop-pattern-generation module 1374C, a second drop-pattern-generation module 1374D, an optimum-drop-pattern-availability module 1374E, a drop-pattern-union module 1374F, a lithography-control module 1374G, and a communication module 1374H. A module includes logic, computer-readable data, or computer-executable instructions. In the embodiment shown in FIG. 13, the modules are implemented in software (e.g., Assembly, C, C++, C#, Java, BASIC, Perl, Visual Basic). However, in some embodiments, the modules are implemented in hardware (e.g., customized circuitry) or, alternatively, a combination of software and hardware. When the modules are implemented, at least in part, in software, then the software can be stored in the storage 1374. Also, some embodiments of the drop-pattern-generation device 1370 include additional modules, omit some of these modules, combine these modules into fewer modules, or divide these modules into more modules. Additionally, the drop-pattern-generation device 1370 includes a material-map repository 1374I and a drop-pattern repository 1374J. The material-map repository 1374I stores field material maps and subregions, and the drop-pattern repository 1374J stores drop patterns (e.g., initial drop patterns, revised drop patterns, full-field drop patterns, optimum drop patterns).

The initialization module 1374A includes instructions that cause the drop-pattern-generation device 1370 to obtain (e.g., set, receive) a drop volume, obtain a field material map, initialize variables, and perform other initialization operations. For example, some embodiments of the initialization module 1374A include instructions that cause the drop-pattern-generation device 1370 to perform at least some of the operations that are described in blocks B405-B410 in FIG. 4, in blocks B705-B710 in FIG. 7, in blocks B805-B810 in FIG. 8, and in block B905 in FIG. 9.

The field-partitioning-and-selection module 1374B includes instructions that cause the drop-pattern-generation device 1370 to partition a drop-pattern-generation field into subregions and to select subregions. For example, some embodiments of the field-partitioning-and-selection module 1374B include instructions that cause the drop-pattern-generation device 1370 to perform at least some of the operations that are described in blocks B415-B420 and B435 in FIG. 4, in blocks B715-B720 and B745 in FIG. 7, in blocks B815-B820 and B850 in FIG. 8, and in blocks B925-B930 and B955-B960 in FIG. 9. Also, the subregions may be stored in the material-map repository 1374I.

The first drop-pattern-generation module 1374C includes instructions that cause the drop-pattern-generation device 1370 to generate initial drop patterns for subregions by performing a first drop-pattern-generation process. Examples of the inputs of the first drop-pattern-generation process include the following: a field material map (e.g., the region of the field material map that corresponds to a subregion), and a drop volume. For example, some embodiments of the first drop-pattern-generation module 1374C include instructions that cause the drop-pattern-generation device 1370 to perform at least some of the operations that are described in block B425 in FIG. 4, in block B725 in FIG. 7, in block B835 in FIG. 8, and in blocks B935-B940 in FIG. 9. Also, the initial drop patterns may be stored in the drop-pattern repository 1374J.

The second drop-pattern-generation module 1374D includes instructions that cause the drop-pattern-generation device 1370 to generate revised drop patterns for subregions by performing a second drop-pattern-generation process. Examples of the inputs of the second drop-pattern-generation process include the following: an initial drop pattern, a field material map (e.g., the region of the field material map that corresponds to a subregion), the drop volume, and one or more border areas of neighboring revised drop patterns. For example, some embodiments of the second drop-pattern-generation module 1374D include instructions that cause the drop-pattern-generation device 1370 to perform at least some of the operations that are described in block B425 in FIG. 4, in blocks B730-B740 in FIG. 7, in blocks B840-B845 in FIG. 8, and in blocks B945-B950 in FIG. 9. Also, the revised drop patterns may be stored in the drop-pattern repository 1374J.

The optimum-drop-pattern-availability module 1374E includes instructions that cause the drop-pattern-generation device 1370 to determine whether respective optimum drop patterns are available (e.g., stored in a database) for subregions and assign respective optimum drop pattern to subregions. For example, some embodiments of the optimum-drop-pattern-availability module 1374E include instructions that cause the drop-pattern-generation device 1370 to perform at least some of the operations that are described in blocks B825-B830 in FIG. 8 and in blocks B915-B920 in FIG. 9.

The drop-pattern-union module 1374F includes instructions that cause the drop-pattern-generation device 1370 to generate a drop pattern for a full drop-pattern-generation field based on the drop patterns (e.g., revised drop patterns, optimum drop patterns) of the subregions that compose the full drop-pattern-generation field. For example, some embodiments of the drop-pattern-union module 1374F include instructions that cause the drop-pattern-generation device 1370 to perform at least some of the operations that are described in block B440 in FIG. 4, in block B750 in FIG. 7, in block B855 in FIG. 8, and in block B965 in FIG. 9.

The lithography-control module 1374G includes instructions that cause the drop-pattern-generation device 1370 to regulate, control, or direct other components or subsystems of a nanoimprint lithography system, such a substrate positioning stage, an imprint head, a fluid dispenser, an energy source, and a camera.

The communication module 1374H includes instructions that cause the drop-pattern-generation device 1370 to communicate with one or more other devices (e.g., a nanoimprint-lithography-control device, a substrate positioning stage, an imprint head, a fluid dispenser, an energy source, a camera, a monitor, another computing device).

FIG. 14A illustrates an example embodiment of a residual layer. In FIG. 14A, a patterned layer 125 has been formed on a substrate 102. The patterned layer 125 includes a residual layer 153 and a plurality of features that are shown as protrusions 151 and recesses 152. The protrusions 151 have an imprint thickness $h_p$, and the residual layer 153 has a residual layer thickness (RLT) $h_{rl}$.

FIG. 14B illustrates an example embodiment of a top layer. FIG. 14B shows a patterned layer 125 that has been formed on a substrate 102, which includes recesses and protrusions. The substrate 102 is held by a substrate chuck 104. The patterned layer 125 fills in the recesses and protrusions in the substrate 102. The top layer 154, which may be referred to as the overburden, is formed above the substrate 102 and has a top layer thickness (TLT) $h_{tl}$. Also, an upper surface 155 of the top layer 154 is featureless and planar.

At least some of the above-described devices, systems, and methods can be implemented, at least in part, by providing one or more computer-readable media that contain computer-executable instructions for realizing the above-described operations to one or more computing devices that are configured to read and execute the computer-executable instructions. The systems or devices perform the operations of the above-described embodiments when executing the computer-executable instructions. Also, an operating system on the one or more systems or devices may implement at least some of the operations of the above-described embodiments.

Furthermore, some embodiments use one or more functional units to implement the above-described devices, systems, and methods. The functional units may be implemented in only hardware (e.g., customized circuitry) or in a combination of software and hardware (e.g., a microprocessor that executes software).

The invention claimed is:

1. A method of generating a drop pattern, the method comprising:
   obtaining a material map of a region;
   dividing the region into a plurality of subregions;

performing, for each of one or more subregions of the plurality of subregions, a first drop-pattern-generation process, wherein the first drop-pattern-generation process generates a respective initial drop pattern for the subregion based on the material map;

performing, for each of the one or more subregions of the plurality of subregions, a second drop-pattern-generation process, wherein the second drop-pattern-generation process generates a respective revised drop pattern for the subregion based on the material map and on the respective initial drop pattern for the subregion, and wherein the first drop-pattern-generation process and the second drop-pattern-generation process are different from each other; and depositing formable material on a substrate in accordance with the one or more revised drop patterns.

2. The method of claim 1, wherein the subregions do not overlap, and wherein an aggregate of the subregions includes all of the region.

3. The method of claim 1, wherein the first drop-pattern-generation process has a runtime that is shorter than a runtime of the second drop-pattern-generation process.

4. The method of claim 3, wherein the first drop-pattern-generation process is non-iterative, and wherein the second drop-pattern-generation process is iterative.

5. The method of claim 1, wherein the second drop-pattern-generation process changes one or more drop locations in the initial drop patterns.

6. The method of claim 1, further comprising:
combining the revised drop patterns, thereby forming a drop pattern for the region.

7. The method of claim 1, further comprising:
classifying each subregion of the plurality of subregions as either a subregion for which a drop pattern is to be generated or, alternatively, as a subregion for which a drop pattern is not to be generated,
wherein the one or more subregions of the plurality of subregions are the subregions that are classified as a subregion for which a drop pattern is to be generated.

8. The method of claim 7, wherein each subregion that is classified as a subregion for which a drop pattern is not to be generated is a subregion for which a drop pattern is already stored.

9. The method of claim 1, wherein the region is an imprint field.

10. The method of claim 1, wherein the region is an entire imprintable area on a substrate.

11. The method of claim 1, wherein the respective revised drop pattern of each subregion of the one or more subregions includes a number of drops that is equal to a number of drops included in the respective initial drop pattern of the subregion.

12. The method of claim 1, wherein the respective revised drop pattern of each subregion of the one or more subregions has a total drop volume that is equal to a total drop volume of the respective initial drop pattern of the subregion.

13. The method of claim 1,
wherein the first drop-pattern-generation process has a linear runtime, and
wherein the second drop-pattern-generation process has a quadratic runtime or another polynomial runtime.

14. The method of claim 1,
wherein the plurality of subregions do not overlap each other, and
wherein an aggregate of the plurality of subregions includes an entirety of the region.

15. The method of claim 1, wherein the first drop-pattern-generation process is non-iterative, and wherein the second drop-pattern-generation process is iterative.

16. The method of claim 1, wherein the first drop-pattern-generation process and the second drop-pattern generation process have a drop-pattern-generation-process characteristic that is distinct from each other, wherein the drop-pattern-generation-process characteristic is selected from the group consisting of: runtime and iterativeness.

* * * * *